United States Patent
Gulas et al.

(10) Patent No.: US 10,707,487 B2
(45) Date of Patent: Jul. 7, 2020

(54) HYDROPHILIC SURFACE-MODIFIED CARBONACEOUS PARTICULATE MATERIAL

(71) Applicant: Imerys Graphite & Carbon Switzerland Ltd., Bodio (CH)

(72) Inventors: Michal Gulas, Malvaglia (CH); Pirmin Ulmann, Giubiasco (CH); Simone Zürcher, Origlio (CH); Michael Spahr, Bellinzona (CH)

(73) Assignee: Imerys Graphite & Carbon Switzerland Ltd., Bodio (CH)

( * ) Notice: Subject to any disclaimer, the term of this patent is extended or adjusted under 35 U.S.C. 154(b) by 302 days.

(21) Appl. No.: 15/326,203

(22) PCT Filed: Jul. 15, 2015

(86) PCT No.: PCT/EP2015/066212
§ 371 (c)(1),
(2) Date: Jan. 13, 2017

(87) PCT Pub. No.: WO2016/008951
PCT Pub. Date: Jan. 21, 2016

(65) Prior Publication Data
US 2017/0200950 A1 Jul. 13, 2017

(30) Foreign Application Priority Data

Jul. 15, 2014 (EP) ..................................... 14177137
Jul. 18, 2014 (EP) ..................................... 14177643

(51) Int. Cl.
*H01M 4/00* (2006.01)
*H01M 4/583* (2010.01)
(Continued)

(52) U.S. Cl.
CPC .............. *H01M 4/583* (2013.01); *B60L 50/64* (2019.02); *C01B 32/05* (2017.08); *C01B 32/23* (2017.08);
(Continued)

(58) Field of Classification Search
CPC ......... H01M 4/587; H01M 2300/0037; H01M 4/622; H01M 4/583; H01M 4/133;
(Continued)

(56) References Cited

U.S. PATENT DOCUMENTS 6,458,458 B1 * 10/2002 Cooke ...................... C08K 9/08
428/403
9,196,904 B2 * 11/2015 Spahr ....................... C09D 7/69
(Continued)

FOREIGN PATENT DOCUMENTS

JP       2002/141062 A    5/2002
JP       2003-151533 A    5/2003
(Continued)

OTHER PUBLICATIONS

International Search Report and Written Opinion dated Oct. 2, 2015, in International Application No. PCT/EP2015/066212 (11 pgs.).
(Continued)

*Primary Examiner* — Cynthia H Kelly
*Assistant Examiner* — Monique M Wills
(74) *Attorney, Agent, or Firm* — Finnegan, Henderson, Farabow, Garrett & Dunner, LLP

(57) ABSTRACT

The present disclosure relates to a novel surface-modified carbonaceous particulate material having a hydrophilic non-graphitic carbon coating. The material can for example be produced by CVD-coating of a carbonaceous particulate material such as graphite followed by an oxidation treatment under defined conditions. The resulting material exhibits a more hydrophilic surface compared to an unmodified CVD-
(Continued)

Transmission Electron Microscopy image of CVD coated GRAPHITE B coated carbon material, which is desirable in many applications, such as when used as an active material in the negative electrode of lithium ion batteries or in a polymer composite material.

17 Claims, 5 Drawing Sheets

(51) Int. Cl.

| | |
|---|---|
| H01M 10/0525 | (2010.01) |
| H01M 4/587 | (2010.01) |
| H01M 4/36 | (2006.01) |
| C01B 32/23 | (2017.01) |
| C01B 32/05 | (2017.01) |
| B60L 50/64 | (2019.01) |
| C23C 16/26 | (2006.01) |
| C23C 16/44 | (2006.01) |
| C23C 16/56 | (2006.01) |
| H01M 2/16 | (2006.01) |
| H01M 4/04 | (2006.01) |
| H01M 4/133 | (2010.01) |
| H01M 4/62 | (2006.01) |
| H01M 4/66 | (2006.01) |
| H01M 4/70 | (2006.01) |
| H01M 10/0561 | (2010.01) |
| H01M 10/0569 | (2010.01) |
| H01M 4/02 | (2006.01) |

(52) U.S. Cl.
CPC .......... *C23C 16/26* (2013.01); *C23C 16/4417* (2013.01); *C23C 16/56* (2013.01); *H01M 2/16* (2013.01); *H01M 4/043* (2013.01); *H01M 4/0404* (2013.01); *H01M 4/0409* (2013.01); *H01M 4/0428* (2013.01); *H01M 4/0471* (2013.01); *H01M 4/133* (2013.01); *H01M 4/366* (2013.01); *H01M 4/587* (2013.01); *H01M 4/622* (2013.01); *H01M 4/661* (2013.01); *H01M 4/70* (2013.01); *H01M 10/0525* (2013.01); *H01M 10/0561* (2013.01); *H01M 10/0569* (2013.01); *C01P 2004/80* (2013.01); *C01P 2006/12* (2013.01); *C01P 2006/14* (2013.01); *H01M 2004/021* (2013.01); *H01M 2004/027* (2013.01); *H01M 2220/20* (2013.01); *H01M 2300/002* (2013.01); *H01M 2300/0037* (2013.01); *Y02E 60/122* (2013.01); *Y02T 10/7011* (2013.01)

(58) Field of Classification Search
CPC .. H01M 4/0471; H01M 4/043; H01M 4/0428; B60L 50/64
See application file for complete search history.

(56) References Cited

U.S. PATENT DOCUMENTS

| | | | |
|---|---|---|---|
| 2008/0090148 A1 | 4/2008 | Zhenhua et al. | |
| 2013/0252093 A1* | 9/2013 | Yokomizo | H01M 4/133 429/211 |
| 2015/0079477 A1* | 3/2015 | Spahr | C23C 16/26 429/231.8 |

FOREIGN PATENT DOCUMENTS

| | | | | |
|---|---|---|---|---|
| JP | 2002/348109 A | | 12/2008 | |
| KR | 20120081555 A | * | 7/2012 | ............ H01M 4/366 |
| WO | WO 2012/039477 | | 3/2012 | |
| WO | WO 2013/149807 | | 10/2013 | |
| WO | WO 2013/149807 A2 | | 10/2013 | |
| WO | WO 2013/174536 A1 | | 11/2013 | |

OTHER PUBLICATIONS

Rubino, R.S. et al., "The study of irreversible capacity in lithium-ion anodes prepared with thermally oxidized graphite", Journal of Power Sources, Elsevier SA, CH, vol. 81-82, Sep. 1, 1999, pp. 373-377.

Natarajan, C. et al., "Reduction of the irreversible capacity of a graphite anode by the CVD process", Carbon, Elsevier, Oxford, GB, vol. 39, No. 9, Aug. 1, 2001, pp. 1409-1413.

* cited by examiner

Figure 1: Transmission Electron Microscopy image of CVD coated GRAPHITE B
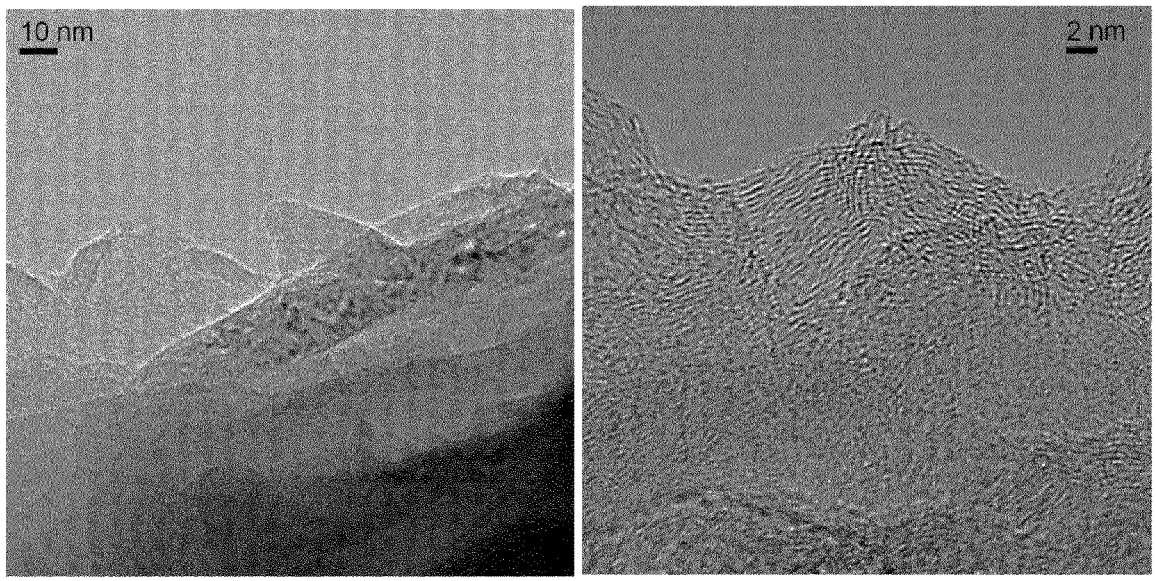
Figure 2: Transmission Electron Microscopy image of CVD coated and oxidized GRAPHITE B
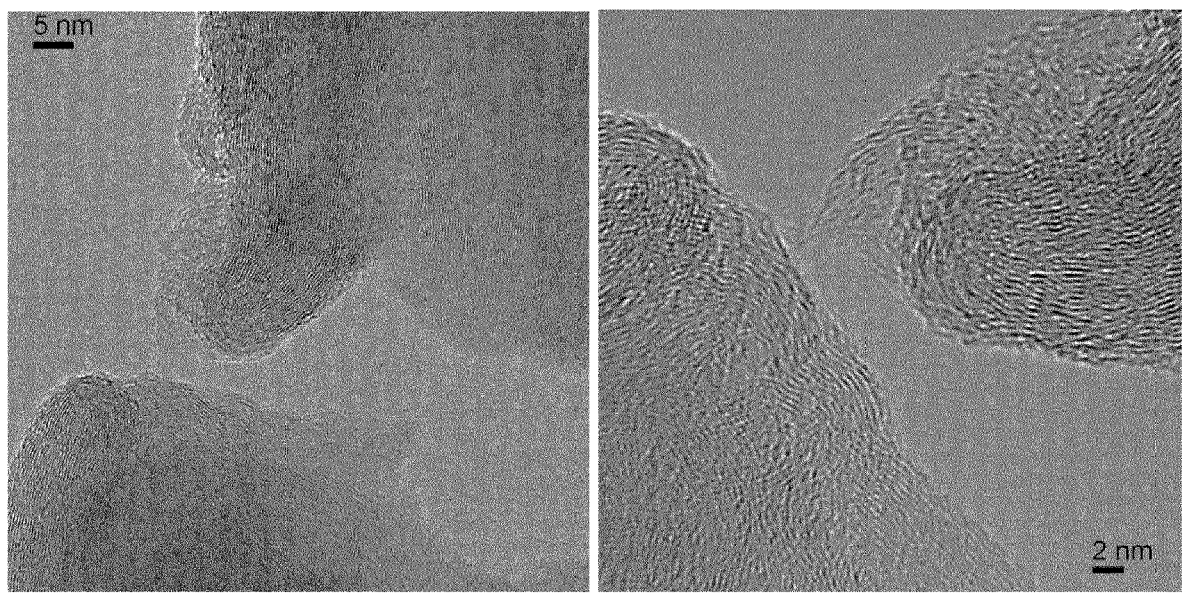

Figure 3: Wetting properties of starting material (GRAPHITE B) and treated material (CVD coated and oxidized GRAPHITE B) after 0s, 1s and 3s.
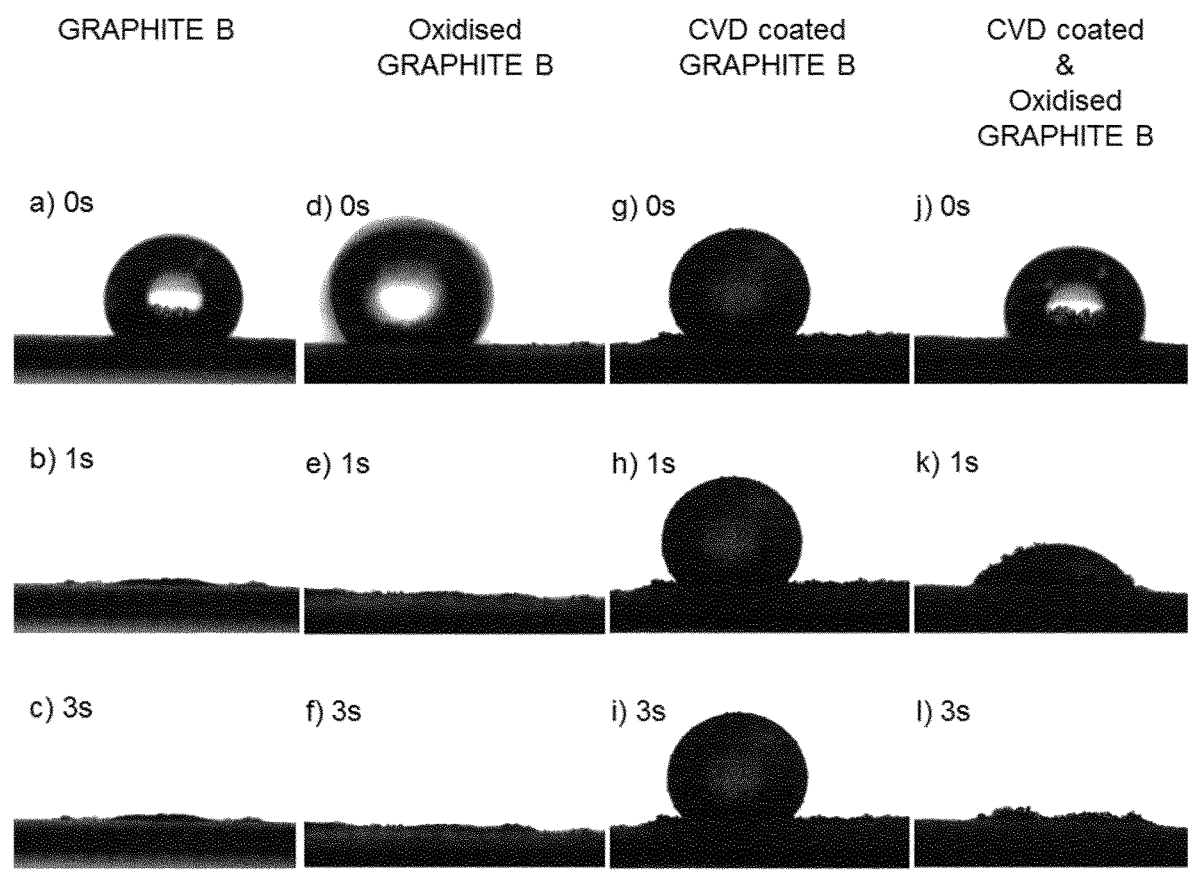

Figure 4: Wetting properties of starting material (GRAPHITE D) and treated material (CVD coated and oxidized GRAPHITE D) after 0s, 1s and 5s.
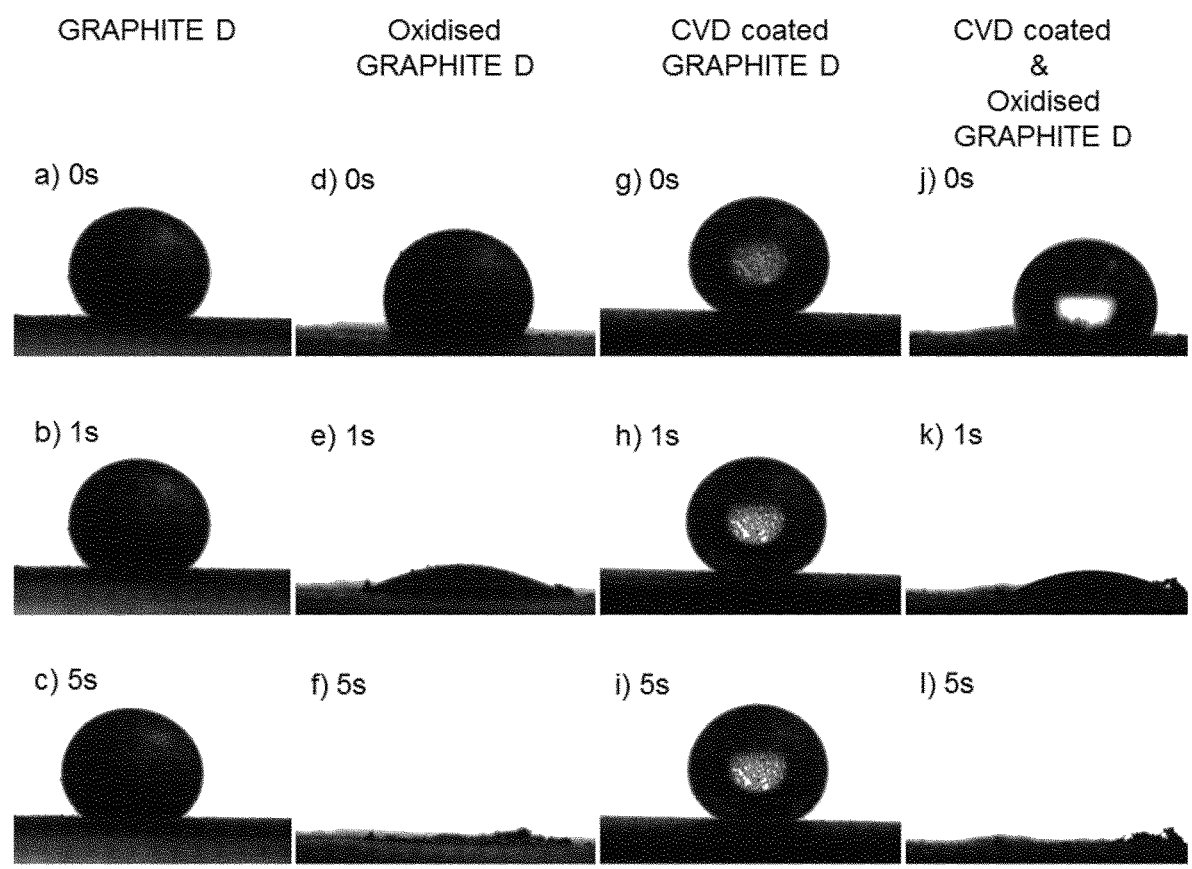

Figure 5: electrochemical half-cell cycling results of hydrophobic carbon coated silicon-containing carbonaceous compound Si-B (Panel A, before oxidation treatment) and of hydrophilic carbon coated silicon-containing carbonaceous compound Si-C (Panel B, after oxidation treatment).
Panel A:
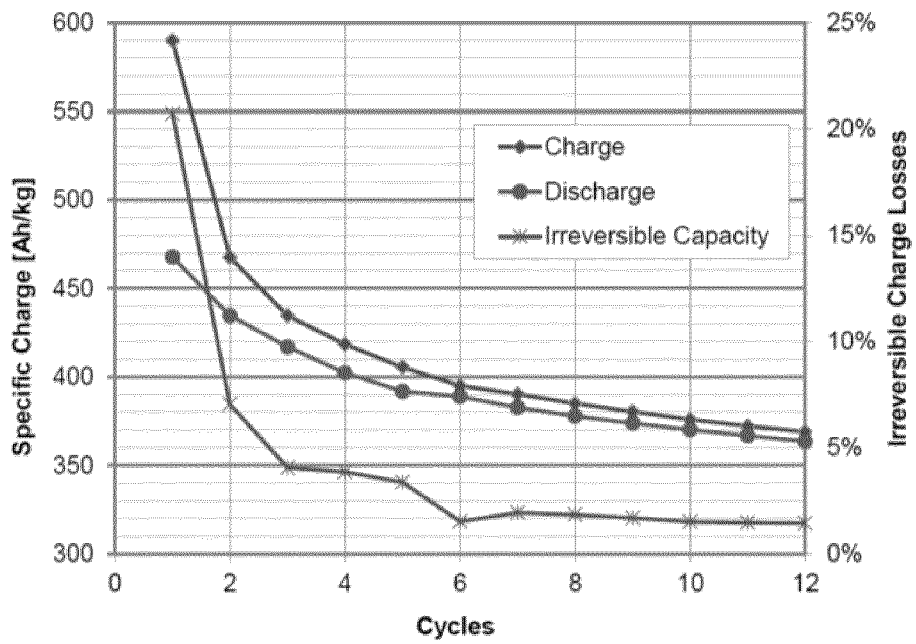
Panel B:
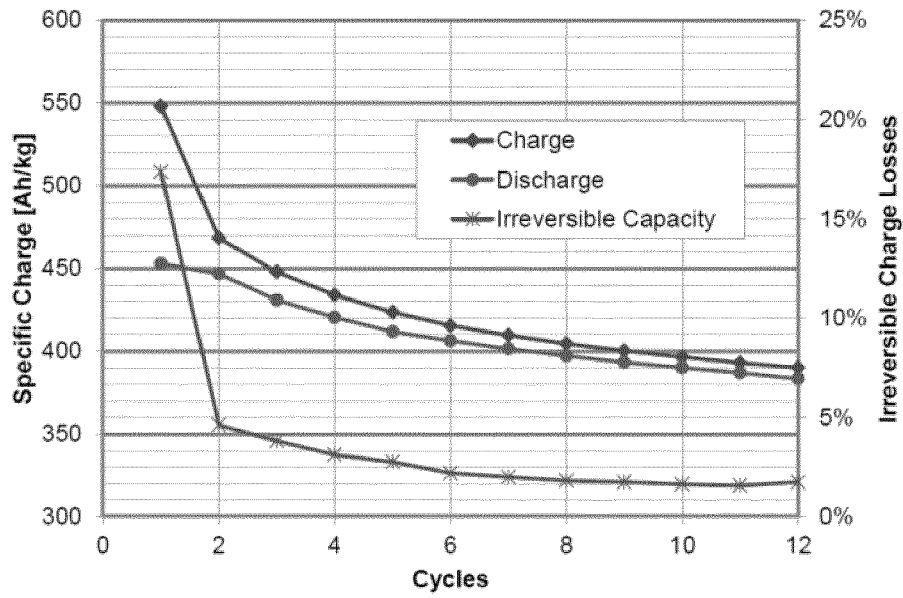

Figure 6: SEM image of a CVD-coated oxidized silicon/graphite composite material Si-C (left panel) and corresponding EDX analysis (right panel).
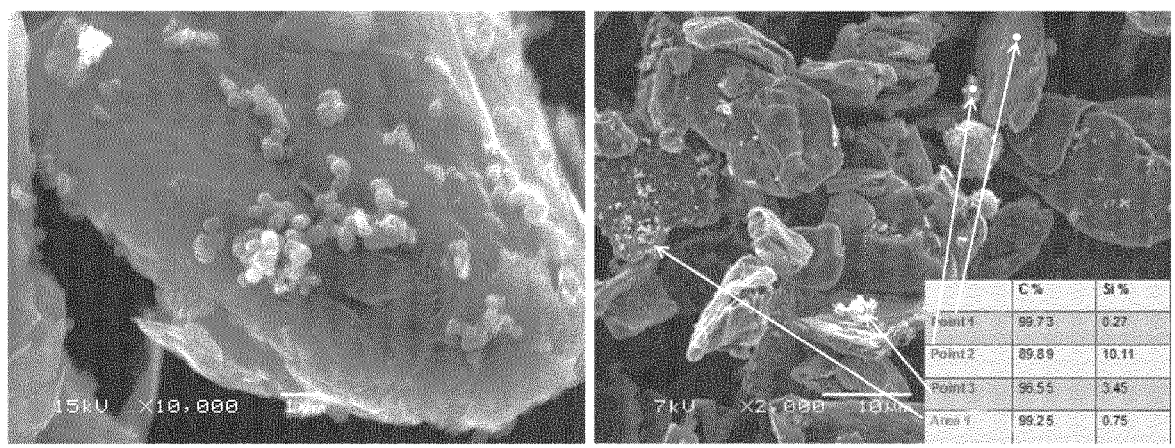

HYDROPHILIC SURFACE-MODIFIED CARBONACEOUS PARTICULATE MATERIAL

CLAIM FOR PRIORITY

This application is a U.S. national phase entry under 35 U.S.C. § 371 from PCT International Application No. PCT/EP2015/066212, filed Jul. 15, 2015, which claims the benefit of priority of EP Application Nos. 14177137.8, filed Jul. 15, 2014, and 14177643.5, filed Jul. 18, 2014, all of which are incorporated herein by reference.

FIELD OF THE DISCLOSURE

The present disclosure relates to novel surface-modified carbonaceous particulate materials with a hydrophilic carbon coating, to processes for preparing said carbonaceous particulate materials and to applications for the same, such as active materials for negative electrodes in lithium-ion batteries.

BACKGROUND

Various graphitic materials are commonly employed as an active material for negative electrodes in lithium-ion batteries. In the process of manufacturing these electrodes, N-methyl pyrrolidone (NMP) has frequently been used as a solvent for the manufacture of electrodes for lithium-ion batteries. For example, the electrode graphitic materials have been generally dispersed in NMP containing a dissolved polyvinylidene fluoride (PVDF) binder. This slurry is coated on a metal foil current collector in a wet coating process; the coating is dried and roll-pressed to the required electrode density. Both the dispersion and wet coating process require a defined rheological behavior of the slurry (i.e. high viscosity at low shear rates for sedimentation stability and thixotropic behavior for proper mixing at high shear rates).

The recent introduction of the REACH regulation (Registration, Evaluation, Authorisation and Restriction of Chemicals) in Europe and similar regulations in other parts of the world, however, has led to severe restrictions for the use of NMP. NMP is classified as a substance of very high concern and suspected to be a reproductive toxicant. Thus, in the field of electrodes, NMP or other organic solvents should be replaced by, for example, water, which consequently requires electrode materials that are suitable for the aqueous coating process.

The replacement of NMP or organic solvents, in turn, has led to another problem, caused by the hydrophobicity of known carbonaceous negative electrode materials. This hydrophobicity gives rise to an insufficient wetting of the carbon surface by water, thereby causing unstable dispersions. These properties lead to difficulties in the coating process, such as i) agglomerates of undispersed carbonaceous particles that may create defects in the coating,
ii) enhanced sedimentation and binder segregation that create inhomogeneities in the coating and uneven electrode surfaces affecting the electrochemical performance of the electrode,
iii) high viscosity, especially at higher solid contents, which do not allow for proper mixing; and/or
iv) long processing time until the hydrophobic carbon material is homogeneously dispersed in the water-based slurry.

In current processes in the industry, these problems have to be addressed by sophisticated and expensive dispersion techniques and the use of dispersants that stabilize the hydrophobic surface of the carbonaceous particles in water.

In addition, the hydrophobicity leads to a further problem in connection with the use of binders. Typically, in water-based electrode manufacturing processes, water-soluble, hydrophilic carboxymethyl cellulose (CMC) binders in combination with styrene-butadiene rubber (SBR) latex binders are employed. However, known hydrophobic carbonaceous materials are not fully compatible with these water soluble binders. In order to exhibit stronger and more resilient (against chemical and mechanical degradation) binding interactions with these binders, the surface of the carbonaceous particulate material should contain hydrophilic functional groups.

Achieving favorable binding interactions between the carbonaceous particulate material and binders will yield beneficial effects, for example on the mechanical integrity of the electrode during cycling as the carbonaceous active material expands and contracts during Li intercalation and de-intercalation. Said favorable interactions further allow minimizing the amount of binder present in the electrode, mitigating any isolating effects that the binder may exhibit on the electrical conductivity of the electrode, and maximizing the active material content in the electrode, i.e. the energy density.

Furthermore, said favorable interactions mitigate binder migration and skinning effects that could potentially occur during electrode drying, which would negatively affect the electrical conductivity and the mechanical integrity of the electrode. A favorable mechanical integrity and electrical conductivity of the electrode leads to a homogeneous current density distribution and thereby to a favorable retention of charge and discharge capacity, especially at elevated currents.

Hydrophobic carbonaceous surfaces are for example created by the coating of graphite particles by a carbon layer used to decrease the BET surface area, the interface area and the reactivity of the graphite negative electrode towards the electrolyte. Low surface area carbon coatings improve electrochemical parameters of the carbon particles by decreasing charge losses, improving cell safety and charge/discharge cycling stability. Furthermore, coating with carbon leads to carbonaceous active materials with favorable pressing behavior, allowing for the manufacturing of electrodes that are sufficiently dense (densities typically in the range of 1.5-1.8 $g/cm^3$) upon pressing at typical process pressures of about 40 $kN/cm^2$, while maintaining a favorable pore network between particles to allow for lithium diffusion between the electrolyte and the electrode. In contrast, electrodes fabricated based on uncoated graphitic materials frequently exhibit very high densities of >1.9 $g/cm^3$, which causes unfavorable diffusion paths for the lithium ions in the electrode pores and therefore a lithium insertion rate restricted by the lithium ion diffusion in the electrode pores.

Although the need to produce hydrophilic carbonaceous particulate materials has grown over the years, only very few processes have been described to produce such hydrophilic carbonaceous particulate materials. Typical surface-coating processes resulting in hydrophobic surfaces are based on a coating of coal tar pitch on carbonaceous particles such as graphite in a dry- or wet-mixing process and a subsequent carbonization at elevated temperature in an inert gas atmosphere [Wan et al., *Journal of Applied Electrochemistry*, 2009, 39, 1081; Yoon et al. *Journal of Power Sources*, 2001, 94, 68]. Another known process described in the art includes the coating of pyrolytic carbon at the graphite surface achieved by treating the graphite particles in hydrocarbon vapors at elevated temperatures (chemical vapor deposition), typically referred to as CVD coating [Han et al., *Electrochimica Acta*, 2003, 48, 1073; Lopez-Honorato et al, *Carbon* 2009, 47,396; Liu et al, *New Carbon Materials*, 2008, 23, 30].

WO 2013/149807 describes surface-modification processes for synthetic graphitic particles obtainable by either an oxidative treatment or, alternatively, by chemical vapor deposition (CVD) coating, which provides graphite materials having improved surface properties. Although both processes are fundamentally different and produce distinct graphitic particles, both processes lead to graphite particles having advantageous properties over unmodified graphite per se.

Having regard to the prior art discussed above, it is therefore an object of the invention to provide surface-modified carbonaceous particulate materials characterized by a hydrophilic surface and exhibiting improved properties, as well as processes for making such materials having favorable physicochemical and electrochemical properties, particularly when used as a material for negative electrodes in lithium-ion batteries.

SUMMARY

A new process has been developed that provides an advantageous hydrophilic coating at the surface of carbonaceous particles, such as graphite or other carbonaceous particulate materials, optionally further containing silicon, tin, bismuth, antimony, aluminum, silver, $SiO_x$ (X=0.2-1.8), $SnO_2$ particles, or other heteroelement particles. The process on the one hand decreases the BET specific surface area (BET SSA) and reactivity towards the electrolytes of the electrochemical cell while at the same time provides a sufficiently hydrophilic surface that, inter alia, ensures excellent wettability and other favorable properties associated with carbonaceous particulate materials having a hydrophilic surface, such as exhibiting sufficiently strong binding interactions with binders. Moreover, the material has been found to exhibit favorable spring-back properties, which inter alia allows to produce electrode materials being less dense, thereby allowing for better Li-ion diffusion which in turn results in a high rate of discharge. In addition, the novel process described herein efficiently reduces the content of polycyclic aromatic hydrocarbons (PAH), whose presence is clearly unwanted in view of their toxicity and environmental problems.

More specifically, the inventors have developed a process to prepare a surface-modified carbonaceous particulate material, involving the coating of the particulate material with a non-graphitic carbon layer (e.g. by chemical vapor deposition, CVD), and subsequently modifying the coated particulate material through an oxidation treatment which introduces hydrophilic surface groups, thereby increasing the hydrophilicity of the particle surface.

Upon manufacturing of a lithium-ion battery, the carbonaceous active material surface comes into contact with highly polar electrolytes such as ethylene carbonate, dimethyl carbonate, ethyl methyl carbonate, etc. Hence, hydrophilic surface groups further provide a beneficial effect regarding the wetting of the electrode surface by the electrolyte and the formation of a robust solid electrolyte interface (SEI) layer on the surface of the carbonaceous active material. The SEI purportedly consists of highly polar inorganic and organic substances, such as lithium ethylene dicarboxylate, lithium hydroxide and lithium fluoride [D. Aurbach et al., *J. Electrochem. Soc.* 1994, 141, 603.]. A hydrophilic surface of the carbonaceous active material will stabilize the interface to the SEI layer due to interactions between functional groups, resulting in protection of the graphitic surface from undesired reactions with the electrolyte and preservation of the pore structure inside the electrode from clogging due to uncontrolled SEI growth or other parasitic reactions at the electrode surface that may occur if the SEI layer does not sufficiently adhere to the carbonaceous active material during lithium intercalation and de-intercalation.

Thus, in a first aspect of the present invention, a surface-modified carbonaceous particulate material is provided which comprises carbonaceous core particles with a hydrophilic non-graphitic carbon coating and having a relatively low BET specific surface area (BET SSA) of below 49 $m^2/g$, wherein the hydrophilic surface modified carbonaceous particulate material may be further defined by exhibiting a wettability characterized by a contact angle after 3 seconds that is less than 90°, and/or a contact angle after 5 seconds that is less than about 60°. Alternatively or in addition, the materials can be defined by a surface energy of at least 59 $mJ/m^2$. The novel surface-modified carbonaceous particulate material may also be defined, alternatively or in addition, by a relatively high spring-back ratio of between about 15 and about 75%.

In another, related aspect, the present invention provides a process for preparing such hydrophilic surface-modified carbonaceous particulate materials as defined herein, wherein a carbonaceous particulate material, such as graphitic carbon is first coated with non-graphitic carbon, for example by a chemical vapor deposition (CVD) process, and subsequently subjected to an oxidation treatment to increase the hydrophilicity of the coated carbonaceous particulate material obtained from the coating step. As noted above, it was found that the oxidation treatment also significantly decreases the PAH concentration in the final material.

Another aspect of the present invention relates to a hydrophilic surface-modified carbonaceous particulate material as herein defined, which is obtainable by the aforementioned processes described in the present disclosure.

Given that the surface-modified carbonaceous particulate material according to the present invention exhibits favorable electrochemical and processing properties, another aspect of the present invention includes the use of the hydrophilic surface-modified carbonaceous particulate material in preparing a negative electrode material for a lithium ion battery.

Yet another, related aspect is therefore the provision of a negative electrode of a lithium ion battery comprising the hydrophilic surface-modified synthetic carbonaceous particulate material as defined herein, as an active material.

Finally, lithium ion batteries comprising said hydrophilic surface-modified carbonaceous particulate material in the negative electrode of the battery are another aspect of the present invention, as are polymer composite materials comprising the hydrophilic carbonaceous particulate material, typically in a ratio of 5-95% (w/w) of the total composition.

BRIEF DESCRIPTION OF THE DRAWINGS

FIG. 1 shows a Transmission Electron Microscopy image of CVD coated GRAPHITE B according to Example 2.

FIG. 2 shows a Transmission Electron Microscopy image of CVD coated and oxidized GRAPHITE B according to Example 2.

FIG. 3 shows the wetting properties of hydrophilic starting material (GRAPHITE B), oxidized Graphite B (uncoated, comparative example), hydrophobic material after the CVD step (CVD-coated GRAPHITE B), and hydrophilic material after the oxidation step (CVD-coated & oxidized GRAPHITE B) according to Example 2. Images were taken after 0 s, 1 s and 3 s. a), b) and c) demonstrate the hydrophilic nature of the starting material, d), e) and f) show the hydrophilic nature of a comparative (uncoated) oxidized GRAPHITE D, g), h) and i) illustrate the hydrophobic nature of CVD coated material, and j), k) and l) show the hydrophilic nature of the material after final oxidation step.

FIG. 4 shows the wetting properties of hydrophobic starting material (GRAPHITE D), oxidized Graphite D (uncoated, comparative example), hydrophobic material after CVD step (CVD-coated GRAPHITE D) and hydrophilic material after the oxidation step (CVD-coated & oxidized GRAPHITE D) according to Example 5. Images were taken after 0 s, 1 s and 5 s. a), b) and c) demonstrate the hydrophobic nature of the starting material, d), e) and f) show the hydrophilic nature of a comparative (uncoated) oxidized GRAPHITE D, g), h) and i) illustrate the hydrophobic nature of CVD coated material, and j), k) and l) show the hydrophilic nature of the material after final oxidation step.

FIG. 5 shows electrochemical half-cell cycling results of hydrophobic, CVD-coated silicon-containing carbonaceous compound Si-B (Panel A) and of hydrophilic CVD-coated and oxidized silicon-containing carbonaceous compound Si-C (Panel B).

FIG. 6 shows an SEM/EDX (scanning electron microscopy/energy-dispersive X-ray spectroscopy) analysis of CVD-coated and oxidized silicon/graphite composite Si-C (left panel: SEM image; right panel: SEM image with corresponding EDX analysis).

DETAILED DESCRIPTION OF THE INVENTION

Certain embodiments of the present invention provide novel hydrophilic surface-modified carbonaceous particulate materials that can be prepared by a two-stage surface-modification process, i.e., a non-graphitic carbon coating technique followed by an oxidation treatment of the particles. By sequentially applying both process steps, the inventors have surprisingly found that it is possible to prepare surface-modified carbonaceous particulate materials comprising a hydrophilic carbon coating with excellent properties.

In the subsequent oxidation of the non-graphitic carbon coating, the inventors found that its morphology is modified, but that the coating remains dimensionally stable. The presence of the hydrophilic non-graphitic carbon coating after oxidation is illustrated by the very small change of disorder as measured by Raman spectroscopy (relative intensity of $I_D$ and $I_G$ bands), by the presence of the carbon coating in TEM images after oxidation of the coating, and by the modest increase of the BET specific surface area (BET SSA) upon oxidation. The BET SSA after oxidation of the coated carbonaceous particulate material remains, however, typically well below the BET SSA of the precursor material without the carbon coating. At the same time, the high efficiency of functionalization of the carbon coating with oxygen-containing groups is illustrated by the hydrophilicity of the oxidized material, for example according to the contact angle/wettability test, by a relatively high surface energy and/or by the increased oxygen content in the carbon coated carbonaceous particulate material after oxidation.

Oxidation conditions can be varied in order to fine-tune the amount of oxygen-containing surface groups to the specific requirements of Li-ion battery applications. As a result of the higher propensity of the non-graphitic carbon coating layer towards oxidation as compared to an uncoated crystalline graphite (because of the higher disorder, as can for example be demonstrated by Raman spectroscopy, see above), a larger amount of oxygen-containing functional groups can be introduced for a given increase of the BET SSA through the oxidation treatment.

It appears that the oxidation treatment slightly increases the surface roughness of the initial non-graphitic carbon coating. Therefore, the combined use of a carbon coating process followed by an oxidation treatment uniquely allows to reach desirable low BET SSA values, e.g. for graphitic active materials, while simultaneously achieving the target of obtaining a surface functionalized with hydrophilic, oxygen-containing groups and an advantageous surface morphology. As a result, the carbonaceous particulate material with a hydrophilic carbon coating exhibits excellent properties and performance characteristics in lithium ion battery anodes and shows higher compatibility with polymers.

The hydrophilic surface of the modified carbonaceous particulate material according to the present invention provides many advantageous effects. Among other things, it leads to an easy dispersion of the carbonaceous particles in water and to a reduced viscosity of the resulting, e.g., aqueous dispersions, thereby allowing for a faster and more facile dispersion process with, inter alia, lower energy input for the manufacturing of water based dispersions of said carbonaceous particles used in the electrode fabrication process or at the same viscosity level a higher possible carbon content of the dispersion and thus a faster drying process to obtain the dry electrode film. The rheology of the coated carbonaceous particulate materials obtained by the novel process described herein when dispersed in an aqueous medium is, for example, advantageous for the wet coating processes applied to produce the electrode films coated on the current collector foil of a lithium ion battery.

The pressing characteristics of the hydrophilic carbonaceous particulate material, including the high spring-back ratio of about 15 to about 75%, is advantageous for electrode manufacturing, leading to densities in the desired range (about 1.5-1.8 $g/cm^3$ upon pressing at ca. 40 $kN/cm^2$) ensuring improved Li-ion diffusion, which leads to high discharge rates in the battery. The modified surface morphology also leads to favorable interactions between the CMC and SBR binders and the hydrophilic carbonaceous particulate material, to efficient wetting of the electrode by the electrolytes, and to the formation of a robust solid electrolyte interface (SEI) layer.

These effects are reflected in favorable discharge capacities for electrodes based on CMC/SBR binders, cycled in the absence of electrolyte additives that aid SEI-formation such as vinylene carbonate, as well as in a favorable retention of galvanostatic charge and discharge capacities (see, e.g., Table 1). In carbonaceous particulate materials containing silicon metal or other metals forming alloys with lithium such as tin, bismuth, aluminum a reduction of irreversible and reversible capacity losses was observed as a result of the hydrophilic carbon coating (cf. FIG. 5). The observed effects reflect that the mechanical integrity of the electrode and the electrolyte-filled porous network are maintained during lithium intercalation and de-intercalation and that the current density distribution in the electrode remains homogeneous. Unfavorable retention of galvanostatic charge and discharge capacities in uncoated materials or coated hydrophobic (i.e. without an oxidation treatment) carbonaceous materials suggest either that the electrical contact between particles is lost due to insufficient binder-carbonaceous active material interaction, or that electrolyte-filled pores are clogged due to uncontrolled SEI growth and other side reactions at the surface of the carbonaceous particles. Besides the improved application properties of the final resulting hydrophilic carbon coated carbonaceous particulate material, another major advantage of the combined coating/surface-modification process described herein lies in a better control and significant reduction of polycyclic aromatic hydrocarbons (PAH) in the resulting hydrophilic coated carbonaceous particulate materials. PAH traces are typically found in coal tar pitch-based coatings of graphite and other carbonaceous particulate materials and are of huge environmental concern. The CVD coating methodology which may also be employed in the process of the present invention also creates a significant amount of PAHs. However, the content of these unwanted PAHs is significantly reduced in the second oxidation treatment step when the carbon coated material is exposed to air (or other suitable gases or vapors), typically at temperatures above 300° C. This additional step therefore enables full control of the PAH concentration of the carbonaceous particles and thus facilitates the handling of the material. A treatment temperature above 500° C. does not only destroy the PAH at the surface, but also ensures desirable hydrophilic surface properties leading to the advantages described above.

The hydrophilic coated carbonaceous particulate materials also show a better compatibility in polymer matrices, for example as used in lithium ion battery electrodes, other electrochemical cells, or more generally in polymer composites that comprise fillers including carbonaceous particulate materials for electrical or thermal conductivity or self-lubrication.

According to certain embodiments, the process according to the present invention further provides the advantage that the starting material, i.e. the core graphite (or other carbonaceous) particles may have a relatively high BET SSA since the non-graphitic carbon coating (e.g. by CVD) substantially reduces the BET SSA yet achieves a high hydrophilicity through the subsequent oxidation treatment.

Surface-Modified Carbonaceous Particulate Materials

The surface-modified carbonaceous particulate materials according to the present invention are comprised of carbonaceous core particles with a hydrophilic non-graphitic carbon coating. The coating (and thus the particles) can inter alia be characterized as hydrophilic in view of their high wettability properties, i.e. the carbonaceous particulate material is capable of adsorbing water when brought in contact with the carbonaceous particulate material. Wettability can for example be measured by a contact angle/wettability test (see Methods section below for details), wherein a droplet of water is placed on a flat surface covered by a layer of the carbonaceous particulate material. For hydrophobic materials (such as unmodified CVD coated graphite) the water droplet will essentially maintain its round/spherical shape (due to its surface tension) while for hydrophilic materials, the water droplet will more or less quickly spread out on the surface and eventually be adsorbed to the material. A contact angle of (well) over 90° after a given time after placing the droplet onto the flattened carbonaceous material surface indicates a hydrophobic material while hydrophilic material will exhibit a contact angle of (well) below 90°, especially after waiting for a few seconds. The different behavior of hydrophobic versus hydrophilic materials is for example illustrated in FIGS. 3 and 4.

Alternatively or in addition, the hydrophilic surface of the carbonaceous particulate material can also be (further) characterized by determining the surface energy of the material, where, similar to the wettability test, the contact angle of an aqueous solution containing 3.5 vol % (=2.7 weight %) of isopropanol is determined essentially in a similar fashion as described above for the wettability test (for details of the procedure see again the Methods section herein below). As the surface tension of such an aqueous solution with 2.7 wt % of isopropanol is 59 mJ/m$^2$ (unit equivalent to mN/m, extrapolated from Vazquez et al, J. Chem. Eng. Data 1995, 40, 611-614), it was found that all surface-modified hydrophilic carbonaceous particulate materials according to the invention adsorbed this solution (or at least had a contact angle of less than 90°). From this observation, it can be concluded that the surface energy of the surface-modified hydrophilic carbonaceous particulate materials described herein was at least 59 mJ/m$^2$.

Thus, in a first aspect the invention relates to a surface-modified carbonaceous particulate material comprising carbonaceous core particles with a hydrophilic carbon coating and having a BET specific surface area (BET SSA) of below 49 m$^2$/g, preferably below 25 m$^2$/g, below 15 m$^2$/g or even below 10 m$^2$/g or in some instances below 5 m$^2$/g (such as 0.5 to 5 m$^2$/g, or 1 to 5 m$^2$/g).

In some embodiments, the hydrophilic surface-modified carbonaceous particulate material may be further defined by exhibiting a wettability characterized by a contact angle after 3 seconds that is less than about 90°, preferably less than 75°, less than 70°, less than 65°, less than 60°, less than 55°, or less than 50°. Alternatively or in addition, the wettability of the hydrophilic surface-modified carbonaceous particulate material can be characterized by a contact angle after 5 seconds of less than about 60°, preferably less than 40°, less than 30°, less than 25°, or less than 20°.

As explained above, in some embodiments the hydrophilic surface-modified carbonaceous particulate material may be further characterized, alternatively or in addition, by a surface energy of at least 59 mJ/m$^2$, preferably at least 62, 67, or 70 mJ/m$^2$, as explained above.

Yet another alternative or additional way of further characterizing the hydrophilic surface-modified carbonaceous particulate material is by its spring-back ratio. The springback of a carbonaceous particulate material after releasing the compression force (which in the present case was 0.477 tons/cm$^2$) is influenced by the crystallinity, texture, particle size, and surface properties of the carbonaceous particles. The surface-modified carbonaceous particulate material according to the present invention may thus in some embodiments be further characterized, alternatively or in addition, by a spring-back ratio of about 15 to about 75%, preferably about 20 to 60% or 25 to 50%.

In certain embodiments, the surface-modified carbonaceous particulate material of the invention may be further characterized by a relatively low polycyclic aromatic hydrocarbons (PAH) content, wherein the polycyclic aromatic hydrocarbons (PAH) concentration is less than 200 mg/kg. Preferably, the PAH content is even lower, such as less than 150 mg/kg, 100 mg/kg, 50 mg/kg, 30 mg/kg, and may not even exceed 10 mg/kg. In some embodiments, the PAH content is even less than 5 mg/kg, less than 2 mg/kg, less than 1 mg/kg, or even less than 0.5 mg/kg. Such low PAH contents may be achieved, for instance, via alternative coating processes besides CVD. The surface-modification process described herein yields carbonaceous particulate material that combines the advantages achieved by the coating (e.g. reducing the active surface area) with a hydrophilic surface and a reduced PAH content.

The core of the surface-modified carbonaceous particulate material according to the present invention may for example be selected from natural graphite, synthetic graphite, exfoliated graphite, graphene, few-layer graphene, graphite fibers, nanographite, graphitized fine coke, or non-graphitic carbon, including hard carbon, carbon black, petroleum- or coal-based coke, glassy carbon, nanotubes, fullerenes, or mixtures thereof. Alternatively, compositions comprising said carbonaceous particulate materials in a mixture with silicon, tin, bismuth, antimony, aluminum, silver, $SiO_x$ (X=0.2-1.8), $SnO_2$, or other heteroelement particles may be used as a core material. In principle, any particulate material for which application of a non-graphitic carbon coating (e.g. a CVD-coating) has been demonstrated can be modified by the processes of the present invention. Since the advantages are particularly useful in the context of lithium ion batteries where the carbonaceous particulate material is used as the active material of the negative electrodes, the carbon core material is preferably natural or synthetic graphite, optionally in a mixture with other heteroelements as described above, with synthetic graphite particularly preferred as its properties can be conveniently selected or tailored according to the needs of a specific application. The use of a carbonaceous precursor material that additionally contains particles of at least one heteroelement with reversible Li-absorption properties (such as silicon, tin or silicon oxide) allows for a further increase of energy capacity in the anode of lithium-ion batteries and is therefore particularly preferred in certain embodiments.

In some embodiments, the hydrophilic carbon coating of the surface-modified carbonaceous particulate material according to the present invention is comprised of oxidized non-graphitic carbon, preferably amorphous with isotropic structure. The coating may for example be obtained by a chemical vapor deposition (CVD) process, which is generally well-known in the art. Alternative non-graphitic carbon coatings that can be subjected to the oxidation treatment may include glass-like carbon, diamond-like carbon (DLC), turbostratic and carbonized pitch-based carbon.

The surface-modified carbonaceous particulate material according to the present invention can in certain embodiments be further characterized by an oxygen content of greater than about 200 ppm, preferably greater than about 400 ppm, greater than about 600 ppm, greater than about 700 ppm, or greater than about 800 ppm. It will be appreciated that the absolute oxygen content of the carbonaceous particulate material depends on the oxygen content of the starting material, but it is clear that the oxygen content is increased by the second step of the process according to the invention ("step b)") when compared to the (untreated) starting material, or, for that matter, the carbon-coated material obtained after the first coating step ("step a)", i.e. before the oxidation treatment). In the special case of graphite, the hydrophilic carbon coating allows to functionalize the graphitic basal plane surfaces which, as all carbons having $sp^2$ configuration (hybridization), do not contain any functional groups at the surface.

As noted above, in principle many different carbonaceous particulate materials can be subjected to the novel process described herein. However, in many cases it is preferred that the surface-modified carbonaceous particulate material of the invention is characterized by a relatively low BET SSA, particularly in lithium ion battery applications. The actual BET SSA of the modified particles is of course dependent on the BET SSA before the coating and the details of the coating process and the subsequent oxidation treatment. In any event, in certain embodiments the BET SSA will be in the range of about 0.5 to about 25 $m^2/g$, or of about 0.5 to about 10.0 $m^2/g$, or of about 0.5 to about 5.0 $m^2/g$, or of about 1.0 to about 5.0 $m^2/g$, or of about 1.2 to about 4.3 $m^2/g$, or of about 1.5 to about 4.1 $m^2/g$.

In relative terms, the surface-modified carbonaceous particulate material of the present invention is in some embodiments further characterized by a BET SSA obtained after step (b) (i.e. oxidation step) which is (i) less than the BET SSA of the unmodified starting material, and/or (ii) equal to or greater than the BET SSA of the carbon coated carbonaceous particulate material obtained from step (a) (i.e. coating step).

Yet another consequence of the coating of the particles is not only a low BET SSA, but also a tunable mesopore area with respect to the total pore area, which allows for the adjustment of the pore size distribution to improve lithium ion diffusion in the electrolyte filled pores. The mesopore area is typically slightly increased upon the subsequent oxidation treatment, while it remains quite low in absolute terms, and certainly lower than the mesopore area of the unmodified starting material. In some embodiments, the surface-modified carbonaceous particulate material can thus be further characterized by a mesopore area of less than about 5.0 $m^2/g$, less than about 4.0 $m^2/g$, less than about 3.8 $m^2/g$, less than about 3.6 $m^2/g$, less than about 3.5 $m^2/g$, less than about 2 $m^2/g$, less than 1.5 $m^2/g$ or even less than 1 $m^2/g$. In certain embodiments, it has been observed that possible microporosity of the starting material appears to vanish almost completely by the surface treatment.

The carbon coating and subsequent oxidation treatment will also typically lower the xylene density compared to the starting material, although the effect is relatively small (often in the range of about 1 to 7% lower than the density of the starting material). Hence, in some embodiments, the surface-modified carbonaceous particulate material of the invention can be further characterized by a xylene density ranging from about 2.1 to 2.260 $g/cm^3$, and preferably from 2.15 to 2.250 $g/cm^3$. However, it will again be appreciated that the hydrophilic surface-modified particles may exhibit a lower xylene density if the core (starting) material already has a low(er) xylene density to begin with.

The particle size distribution (PSD) of the particles is not affected to a large extent by the processes of the present invention. It will thus be governed mainly by the PSD of the starting material prior to the surface modification steps. If anything, the PSD, e.g. expressed as a $D_{90}$ value, will if anything slightly increase due to the coating and will not be much affected by the subsequent oxidation treatment. In any event, the surface-modified carbonaceous particulate material of the present invention can in some embodiments be further characterized by a $D_{90}$ particle size distribution of between 0.5 μm and 100 μm, preferably between 1 and 50 μm, although other particle size values are also possible.

Finally, as briefly noted above, the hydrophilic surface-modified synthetic graphite of the present invention may in certain embodiments be characterized by an $I_D/I_G$ ratio ($R(I_D/I_G)$) of larger than about 0.3, preferably by an $R(I_D/I_G)$ of between 0.4 and 1.0, when measured with a laser having an excitation wavelength of 632.8 nm. This ratio is again dependent on the ratio of the starting material before the treatment, but as a general observation the $I_D/I_G$ ratio increases after the coating step with non-graphitic carbon.

Since the oxidation treatment leads to an increased oxygen content in the material, the hydrophilic surface-modified carbonaceous particulate material can in another aspect of the invention be defined also in an alternative manner. In these embodiments, the hydrophilic surface-modified carbonaceous particulate material is characterized by an oxygen content of greater than about 200 ppm, preferably greater than about 400 ppm, greater than about 600 ppm, greater than about 700 ppm, or greater than about 800 ppm.

These alternative embodiments may optionally be further characterized by any of the parameters already set out above in detail, i.e. wettability, surface energy, spring-back ratio, PAH content, core material, carbon coating, BET SSA, xylene density and $I_D/I_G$ ratio.

Alternatively, the surface-modified carbonaceous particulate material described herein may be defined by containing carbonaceous core particles with a hydrophilic non-graphitic carbon coating, wherein the hydrophilic surface-modified carbonaceous particulate material is characterized by a ratio between the BET SSA and the specific surface energy of less than 0.8, preferably less than 0.6, less than 0.5, less than 0.4, less than 0.3 or less than 0.2. In some embodiments, particularly for low surface area particles, the ratio may be less than 0.15 or 0.1, such as less than 0.06, less than 0.05 less than 0.04, less than 0.03 or less than 0.02. In certain embodiments, the ratio may be less than 0.01 or 0.007.

Since the surface-modified carbonaceous particulate material described herein exhibits a remarkably low viscosity in aqueous dispersions, the hydrophilic surface-modified carbonaceous particulate material can be defined, alternatively, or in addition, by comprising carbonaceous core particles with a hydrophilic non-graphitic carbon coating, and exhibiting a viscosity of between 2,000 and 4,000 mPa·s in an aqueous dispersion containing 40 weight % of said carbonaceous material. Preferably, the viscosity at this concentration is between 2,000 and 3,000 mPa·s, or between 2,300 and 2,600 mPa·s.

Processes for Preparing Hydrophilic Surface-Modified Carbonaceous Particulate Materials Another aspect of the present invention relates to a process for preparing the surface-modified carbonaceous particulate material comprising a hydrophilic non-graphitic carbon coating as described and claimed herein. The hydrophilic non-graphitic carbon coating may be achieved by treating a carbonaceous particulate material, for example selected from the materials mentioned above as the possible core material in gas mixtures containing hydrocarbons at high temperatures to achieve a coating with non-graphitic carbon and subsequently treating the coated particles in an air (or in other suitable oxygen-containing) atmosphere at elevated temperatures yielding a modified, more hydrophilic surface. The oxidation step may also lead to a reduced PAH content of the particles compared to coated particles without such an oxidation treatment.

Thus, in some embodiments, the process for the preparation of the surface-modified carbonaceous particulate material comprising a hydrophilic non-graphitic carbon coating according to the present invention comprises (a) coating of a carbonaceous particulate material with non-graphitic carbon, and (b) a subsequent oxidation treatment to increase the hydrophilicity of the coated carbonaceous particulate material obtained from step (a).

The oxidation treatment is preferably carried out in a manner and for such a period of time until the hydrophilicity of the resulting particulate material fulfils the wettability and/or surface energy characteristics as set out herein.

It has been surprisingly found that desirable hydrophilic properties of the carbon coating can be achieved by combining a carbon deposition step with a subsequent treatment of the coated particles in an oxidizing atmosphere. The deposited non-graphitic carbon at the surface of the carbonaceous particles (step (a)) becomes more hydrophilic when subjected to an oxygen-containing gas at the appropriate temperatures (step (b)).

Without wishing to be bound by any theory, it is believed that the oxidation treatment step introduces functional groups such as carbonyl, carboxyl, hydroxyl, ketone, ketene, aldehyde, alcohol, quinones or alkoxyalkyl groups, etc., thereby rendering the particles more hydrophilic.

The carbonaceous particles to be modified by the process according to the present invention (i.e. the starting material) are preferably selected from natural graphite, synthetic graphite, exfoliated graphite, graphene, few-layer graphene, graphite fibers, nanographite, graphitized fine coke, or non-graphitic carbon, including hard carbon, carbon black, petroleum- or coal-based coke, glassy carbon, nanotubes, fullerenes, or mixtures thereof. Alternatively, compositions comprising said carbonaceous particulate materials in a mixture with silicon, tin, bismuth, antimony, aluminum, silver, $SiO_x$ (X=0.2-1.8), $SnO_2$, or other heteroelement particles may be used as a core material. Given that hydrophilic surface properties are particularly important in lithium ion battery applications, the starting material is in such instances preferably selected from natural or synthetic graphite or heteroatom-containing carbonaceous particulate materials, with synthetic graphite or silicon-containing graphite preferred due to their adjustable properties and high energy density, according to the needs of the respective application.

The non-graphitic carbon-coating of step a) can be achieved by any known and suitable carbon-coating technique known in the art, for example chemical vapor deposition (CVD), physical vapor deposition (PVD), pitch-coating, pyrolysis, atomic layer deposition (ALD), laser ablation, sputtering, or evaporation (see, for example HANDBOOK OF DEPOSITION TECHNOLOGIES FOR FILMS AND COATINGS Science, Technology and Applications Second Edition Noyes Publications, Park Ridge, N.J., U.S.A., (Ed. Rointan F. Bunshah), 1994, F. Xiong, MRS Proceedings, Vol. 270, 1992, or S. Bhardwaj et al., Carbon Letters, 2007, 8, 285-291). Alternatively, the amorphous carbon coating may also be achieved by a technique wherein the carbonaceous particles are dispersed in a suitable liquid, preferably water or water-based solvent, in the presence of an amphiphilic material. After removal of the solvent, the carbonaceous material coated with a layer of the amphiphilic molecule(s) is subjected to a heat treatment in an inert atmosphere to achieve carbonization. This process is described in more detail in PCT/EP2015/058112 by the present applicant (Imerys Graphite & Carbon), which is herewith incorporated by reference in its entirety.

In any case, CVD coating is one of the preferred methods for obtaining the carbon coating of step a).

The chemical vapor deposition (CVD) step is in certain embodiments carried out by contacting the carbonaceous particulate material to be treated with a hydrocarbon gas or alcohol vapor mixed with an inert carrier gas. The hydrocarbon gas is preferably chosen from an aliphatic or aromatic hydrocarbon selected from the group consisting of methane, ethane, ethylene, propane, propene, acetylene, butane, isobutene, benzene, toluene, xylene, liquefied petroleum gas (LPG), natural gas, and combinations thereof.

Particularly preferred hydrocarbon gases are acetylene, natural gas, methane or propane. The alcohol used in the CVD coating step (a) is preferably selected from the group consisting of ethanol, propanol, isopropanol, and combinations thereof, with ethanol or propanol being particularly preferred. The hydrocarbon gas or alcohol vapor may also be mixed with an inert carrier gas such as nitrogen or argon, preferably nitrogen.

Suitable gas flow rates for the CVD coating are generally dependent on the particular circumstances (reactor type, load, residence time, and type of starting material), and can be determined by those of skill in the art using the information contained herein. In some embodiments, good results were obtained with propane or acetylene gas with a flow rate of around 1 to 5 L/min, of around 1 to 3 L/min, or of around 1 to 2 L/min, optionally in combination with an inert carrier gas with a flow rate of around 1 to 10 L/min, of around 1 to 8 L/min, of around 2 to 5 L/min, or 2 to 3 L/min although the exact flow rate depends on the reactor type, material to be treated and other process parameters. In other embodiments, a pre-prepared mixture of propane or acetylene gas with nitrogen or argon carrier gas can be used for the CVD coating step. For example, in a fluidized bed reactor the coating is achieved with higher flow rates, for example with a flow rate of around 1 to 50 L/min, 10 to 25 L/min, or 20 to 25 L/min. In some embodiments, the ratio of the propane or acetylene gas to the inert carrier gas in the mixture is about 1:10 or 1:9.

The CVD coating step according to certain embodiments of this aspect of the present invention is typically carried out with residence times in the reactor ranging from 10 to 180 minutes, 10 to 120 minutes, 10 to 60 minutes, or 20 to 40 minutes.

The temperatures for the CVD coating step will typically range from 500 to 1200° C., although in many cases, the temperature will typically range from 600 to 1100° C., or from 700 to 1050° C.

The contacting period between the starting material and the hydrocarbon gas or alcohol vapors for achieving the CVD coating of step a) usually ranges from 10 to 180 minutes, from 10 to 120 minutes, from 10 to 60 minutes, or from 20 to 40 minutes.

The CVD coating step is generally carried out at a slight overpressure. Thus, in certain embodiments, the CVD coating step is carried out at a pressure of 0 to 80 mbar, 0 to 60 mbar, 0 to 50 mbar, 10 to 60 mbar, 10 to 50 mbar, or 0 to 40 mbar above atmospheric pressure.

The oxidation treatment of the process for preparing the surface-modified carbonaceous particulate material can generally be achieved in a gaseous/solid phase process, or, alternatively, in a liquid/solid phase process by contacting the coated particles with a suitable source of oxygen. Suitable gaseous oxidants may in some embodiments be selected from air, carbon dioxide, water vapor, oxygen, ozone, or combinations thereof, generally at elevated temperature. In many embodiments of this aspect of the invention, the oxidation treatment is conveniently carried out with air or synthetic air. Alternatively, the oxidation may also be achieved in a liquid/solid phase process, by contacting the coated particles with a liquid comprising a suitable oxidant. Aqueous hydrogen peroxide is for example a suitable source of oxygen in such a liquid/solid phase process.

The flow rate of the oxidant in the oxidation treatment step b) typically ranges from 1 to 50 L/min, or from 1 to 20 L/min, from 2 to 10 L/min, or from 2 to 5 L/min, although the exact flow rate depends on the reactor type, the material to be treated and other process parameters. Thus, for example when the process is carried out in a (single) fluidized bed reactor, the flow rate of the gas in the oxidation treatment step may range from 10 to 30 L/min, or 10 to 20 L/min.

The oxidation treatment according to certain embodiments of the present invention is generally performed at temperatures ranging from 300 to 900° C., and preferably from 500 to 900° C., from 550 to 750° C., or from 550 to 600° C., although the oxidation treatment can also be conveniently carried out at lower temperatures, or even ambient temperatures, especially when employing the highly reactive gas ozone.

The treatment time for the oxidation step b) usually ranges from 1 to 30 minutes, or 10 to 25 minutes, and is preferably carried out for 15 to 20 minutes.

As explained above, the oxidation treatment according to the present invention causes the PAHs to burn off and creates functional groups such as carbonyl, carboxyl, hydroxyl, ketone, ketene, aldehyde, alcohol, quinones and alkoxyalkyl groups, etc., thereby leading to an improved surface reactivity of the hydrophilic surface-modified carbonaceous particulate materials according to the present invention.

In any event, the process parameters such as temperature, treatment time, pressure and gas selection as well as flow rate during the oxidation treatment can be easily adapted by those of skill in the art to obtain the desired product characteristics and parameters of the surface-treated synthetic graphite material as described herein, using the information in the present disclosure.

The process parameters for the preparation of the hydrophilic surface-modified carbonaceous particulate material according to the present invention are preferably adjusted such that the BET SSA of the surface-modified carbonaceous particulate material obtained after step (b) is less than the BET SSA of the starting carbonaceous particulate material; and/or equal to or greater than the BET SSA of the carbon coated carbonaceous particulate material obtained from the coating step (step (a)). In certain embodiments, the process of the invention leads to a reduction of the BET SSA of between 10 and 90%, preferably between 20 and 80% compared to the untreated starting material.

Alternatively or in addition, the process parameters are adjusted such that the $D_{90}$ particle size distribution of the surface-modified carbonaceous particulate material obtained from the oxidation treatment (step (b)) is in the same range as the $D_{90}$ PSD of the carbon-coated carbonaceous particulate material obtained from step (a), and also similar to the $D_{90}$ PSD of the starting carbonaceous particulate material. In some embodiments, the process parameters are adjusted such that the $D_{90}$ particle size distribution of the hydrophilic surface-modified carbonaceous particulate material obtained from step (b) according to the present invention lies within ±10%, or within ±5% of the $D_{90}$ particle size distribution value of the (unmodified) starting material.

Alternatively or in addition, the process parameters can be adjusted such that the surface-modified carbonaceous particulate material is characterized by a mesopore area of the surface-modified carbonaceous particulate material obtained from step (b) being (i) less than the mesopore area of the starting carbonaceous particulate material; and/or (ii) equal to or greater than the mesopore area of the carbon coated carbonaceous particulate material obtained from step (a).

Alternatively or in addition, the process parameters may be adjusted such that the xylene density of the surface-modified carbonaceous particulate material obtained from step (b) is lowered by 1 to 10%, preferably 1 to 7% compared to the xylene density of the starting carbonaceous particles.

The process for the preparation of the surface-modified carbonaceous particulate material according to the present invention is typically carried out in a reactor, preferably wherein the reactor is a continuously driven or batch rotary furnace, a tumbling bed reactor, a fluidized bed reactor, a fixed bed reactor, or a multiple hearth furnace, although it is readily apparent that other reactor types are generally possible as well as long as they are suitable to carry out the process steps as described herein (and allow the contact of the reactive media with the particles to be coated).

The process steps (a) and (b) according to some embodiments of the present invention can conveniently be carried out in the same reactor, preferably wherein the reactor is purged with an inert gas (e.g. nitrogen, argon, and the like) after the non-graphitic carbon coating of step (a), and prior to the oxidative treatment of step (b). In other words, it is readily understood that the process steps (a) and (b) can either be carried out in a separate two-step process (with the coating step being the initial process), or it can be implemented as a "single reactor", yet two-step process with defined separate treatment conditions, divided into an initial coating process followed by the surface oxidation treatment as described herein.

In case of a classical two-step process, the carbon-coated carbonaceous particulate material obtained during the first process step of the present invention is typically recovered from the reactor, and subsequently transferred into the same or a different reactor or furnace for the oxidative treatment of step (b). For the single reactor alternative, the carbonaceous particulate material stays in the same reactor while first being subjected to the coating process and subsequently subjected to the oxidation treatment, preferably with a purging step with inert gas to remove any traces of the hydrocarbon gas used for the coating process.

When the process according to the present invention is carried out in a rotary furnace, a suitable inclination of the rotary furnace during the coating and subsequent oxidation step will range from 3 to 9°, or from 5 to 8°, or 5 to 7.5°.

These values should be understood to illustrate the process parameters for a rotary furnace, giving a rough guidance to achieve the desired result. In any event, those of skill in the art will understand how to adjust the process parameters such as temperature, choice and flow rate of process gas, and residence time so as to arrive at a hydrophilic surface-modified carbonaceous particulate material coated with oxidized non-graphitic carbon as defined hereinabove and in the appended claims.

The properties of the final surface-modified carbonaceous particulate material are of course also dependent on the properties of the carbonaceous starting material, i.e. the carbon particles forming the core of the novel carbonaceous particulate material. Given that the carbon coating step of the process typically lowers the BET SSA of the carbonaceous particulate material (sometimes considerably), the processes of the present invention also allow the use of relatively high surface area carbonaceous particulate material as the starting material. Typically, however, the BET surface area of the carbonaceous starting material ranges from 0.5 to 10 $m^2/g$, from 0.5 to 8 $m^2/g$, from 1.5 to 7.5 $m^2/g$, although starting materials with a higher (or lower) surface area can likewise be used as a starting material in the processes of the present invention.

Many suitable carbonaceous (such as graphitic) core materials subjected to the process according to the present invention are commercially available and can be employed in the processes of the invention.

Surface-Modified Carbonaceous Particulate Material Prepared According to the Present Invention Another aspect of the present invention is related to the hydrophilic surface-modified carbonaceous particulate material as defined herein obtainable by any of the processes described herein.

Use of the Surface-Modified Carbonaceous Particulate Materials

Since the obtained hydrophilic surface-modified carbonaceous particulate materials as defined herein exhibit excellent electrochemical properties, yet another aspect of the present invention relates to the use of said surface-modified carbonaceous particulate material for preparing a negative electrode material for a lithium ion battery.

Downstream Products employing the Surface-Modified Carbonaceous Particulate Materials Consequently, a negative electrode of a lithium ion battery which comprises the hydrophilic surface-modified carbonaceous particulate material as defined herein as an active material represents another aspect of the present invention. This includes electrodes where the negative electrodes comprise less than 100% of the carbonaceous particulate material according to the present invention as an active material. In other words, negative electrodes containing mixtures with yet other materials (graphite or otherwise) are likewise contemplated as an aspect of the present invention.

For example, in some embodiments, the carbonaceous core particles comprises natural graphite and/or synthetic graphite, and the negative electrode further comprises additional natural graphite, synthetic graphite, and/or graphitized fine coke, preferably wherein the additional natural graphite, synthetic graphite, and/or graphitized fine carbon is present in an amount ranging from 2% to 10%, or 3% to 5% by weight of the negative electrode. In other embodiments, the negative electrode may include mixtures of the hydrophilic surface-modified carbonaceous particulate material with uncoated synthetic or natural graphite with high degree of crystallinity. Alternatively, the additional natural graphite, synthetic graphite, and/or graphitized fine coke may be pitch-coated. Typical concentrations of the uncoated high crystallinity graphite could be 2 to 10 wt. % of the total electroactive mass in the negative electrode. The average particle size ($D_{50}$) of the additional natural graphite, synthetic graphite, and/or graphitized fine coke may range from 0.5 to 100 μm, or from 1 to 20 μm.

The present invention also relates to lithium ion batteries comprising the hydrophilic surface-modified carbonaceous particulate material as defined herein as the active material in the negative electrode of the battery. Again, batteries wherein the negative electrodes contain mixtures with yet other carbonaceous particulate materials are also included in this aspect of the invention.

Moreover, certain embodiments of the present invention also include polymer composite materials comprising the hydrophilic surface-modified carbonaceous particulate material as defined herein, typically in a weight ratio of 5-95% by weight, preferably representing 10 to 85% by weight of the total composition.

In yet another aspect, the present invention relates to an energy storage device comprising the hydrophilic surface-modified carbonaceous particulate material according to the present invention.

A further aspect of the present invention relates to a carbon brush comprising the hydrophilic surface-modified carbonaceous particles according to the present invention.

An electric vehicle, hybrid electric vehicle, or plug-in hybrid electric vehicle which comprises a lithium ion battery, wherein the lithium ion battery comprises the hydrophilic surface-modified carbonaceous particulate material as defined herein as an active material in the negative electrode of the battery represents another aspect of the present invention. In some embodiments of this aspect, the carbonaceous particles comprise graphitic material, while in other materials the carbonaceous particles comprise non-graphitic material, both optionally in a mixture with other heteroelements, as described herein.

In addition, a ceramic, ceramic precursor material, or a green material comprising the hydrophilic surface-modified carbonaceous particulate material as defined herein as a pore forming material are another aspect of the present invention.

Yet another aspect of the present invention relates to a dispersion comprising a liquid, preferably water or water-based, and a surface-modified carbonaceous particulate material comprising carbonaceous core particles with a hydrophilic non-graphitic carbon coating, wherein the dispersion has a low viscosity at a shear rate of 10 s$^{-1}$ of between 2,000 and 4,000 mPa·s in an aqueous dispersion containing 40 wt % of said carbonaceous material. Preferably the viscosity at this concentration and shear rate is between 2,000 and 3,000 mPa·s, or between 2,300 and 2,600 mPa·s.

In certain embodiments of this aspect of the invention, said surface-modified carbonaceous particulate material in the dispersion is characterized by (i) a BET SSA of less than 49 m$^2$/g, preferably less than 25 m$^2$/g or less than 10 m$^2$/g; and/or (ii) an oxygen content of greater than about 200 ppm, greater than about 400 ppm, greater than about 600 ppm, greater than about 700 ppm, or greater than about 800 ppm. In other embodiments, the hydrophilic surface-modified carbonaceous particulate material is characterized by any of the parameters described above and the attached claims.

The dispersion may optionally further contain unmodified carbonaceous particles, wherein the hydrophilic surface-modified carbonaceous particles are present in an amount ranging from 10 to 99 wt. % of a total amount of carbonaceous particles, or 20 to 90% of the total amount of carbonaceous particles, or 30 to 85 wt. % of the total amount carbonaceous particles.

The hydrophilic surface-modified carbonaceous particulate material of the present invention may optionally be further defined by an average particle size ($D_{50}$) ranging from 0.5 to 100 μm, or from 1 to 50 μm.

Suitable methods for determining the various properties and parameters used to define the products described herein are set out in more detail below.

Measurement Methods

The percentage (%) values specified herein are by weight, unless specified otherwise.

Specific BET Surface Area, DFT Micropore and Mesopore Volume and Area

The method is based on the registration of the absorption isotherm of liquid nitrogen in the range p/p0=0.04-0.26, at 77 K. The nitrogen gas adsorption is performed on a Quantachrome Autosorb-1. Following the procedure proposed by Brunauer, Emmet and Teller (Adsorption of Gases in Multimolecular Layers, *J. Am. Chem. Soc.*, 1938, 60, 309-319), the monolayer capacity can be determined. On the basis of the cross-sectional area of the nitrogen molecule, the monolayer capacity and the weight of sample, the specific surface can then be calculated. The isotherm measured in the pressure range p/p0 0.01-1, at 77 K are measured and processed with DFT calculation in order to assess the pore size distribution, micro- and mesopore volume and area.

Reference

Ravikovitch, P., Vishnyakov, A., Russo, R., Neimark, A., Langmuir 16 (2000) 2311-2320; Jagiello, J., Thommes, M., Carbon 42 (2004) 1227-1232.

Particle Size Distribution by Laser Diffraction

The presence of particles within a coherent light beam causes diffraction. The dimensions of the diffraction pattern are correlated with the particle size. A parallel beam from a low-power laser lights up a cell which contains the sample suspended in water. The beam leaving the cell is focused by an optical system. The distribution of the light energy in the focal plane of the system is then analyzed. The electrical signals provided by the optical detectors are transformed into the particle size distribution by means of a calculator. The method yields the proportion of the total volume of particles to a discrete number of size classes forming a volumetric particle size distribution (PSD). The particle size distribution is typically defined by the values $D_{10}$, $D_{50}$ and $D_{90}$, wherein 10 percent (by volume) of the particle population has a size below the $D_{10}$ value, 50 percent (by volume) of the particle population has a size below the $D_{50}$ value and 90 percent (by volume) of the particle population has a size below the $D_{90}$ value.

The particle size distribution data by laser diffraction quoted herein have been measured with a MALVERN Mastersizer S. For determining the PSD, a small sample of a carbon material is mixed with a few drops of wetting agent and a small amount of water. The sample prepared in the described manner is introduced in the storage vessel of the apparatus (MALVERN Mastersizer S) and after 5 minutes of ultrasonic treatment at intensity of 100% and the pump and stirrer speed set at 40%, a measurement is taken.

References

ISO 13320 (2009)/ISO 14887

Xylene Density

The analysis is based on the principle of liquid exclusion as defined in DIN 51 901. Approx. 2.5 g (accuracy 0.1 mg) of powder is weighed in a 25 ml pycnometer. Xylene is added under vacuum (15 Torr). After a few hours dwell time under normal pressure, the pycnometer is conditioned and weighed. The density represents the ratio of mass and volume. The mass is given by the weight of the sample and the volume is calculated from the difference in weight of the xylene filled pycnometer with and without sample powder.

Reference

DIN 51 901

Oxygen Content

Oxygen mass fractions in solid samples are evaluated using the principles of inert gas fusion or solid carrier gas heat extraction. The sample is placed in a graphite crucible and inserted into an electrode furnace. The crucible is maintained between the upper and lower electrodes of an impulse furnace. A high current passes through the crucible after purging with inert gas (He or Ar) creating an increase of the temperature (above 2500° C.). Gases generated in the furnace are released into flowing inert gas stream. The gas stream is then sent to the appropriate infrared (O as CO by NDIR) or thermal conductivity (N and H by TCD) detectors for measurement. Instrument calibrations are performed using known reference materials.

Raman Spectroscopy

Raman analyses are performed using LabRAM-ARAMIS Micro-Raman Spectrometer from HORIBA Scientific with a 632.8 nm HeNe LASER. Ratio $I_D/I_G$ is based on the ratio of intensities of as called band D and band G. These peaks are characteristic for carbon materials, measured at 1350 $cm^{-1}$ and 1580 $cm^{-1}$ respectively.

Spark Discharge Optical Emission Spectroscopy (SD OES)

The SD OES analysis was performed by an SDAR OES Simultaneous Emission Spectrometer (optical emission spectrometer (OES) with spark discharge in argon: ARL Spectrometer 3460).

The carbonaceous particulate material is, if necessary, ground to a maximum particle size of about 80 μm by means of a vibrated mill, e.g. a NAEF mill with a wolfram carbide container. Following the (optional) milling, the sample is passed through a screen (e.g. 0.5 mm) in order to remove any agglomerates or particles that have not been milled to the required particle size. Subsequently, the powder is compacted into a pressed pellet, for example by means of a Herzog Press.

Preparation of a Pressed Pellet (Using the Herzog Press):

After placing a clean cardboard paper at the bottom of the pressing tool, about 6 g of the sample to be analyzed is filled into the round pressing die with at least 20 mm in diameter; a second clean cardboard paper is carefully put on top of the sample. The upper cylinder is lowered and pressure applied until the manometer indicates 20 tons. The pressure is applied for at least 30 seconds; the pressure is then released and the sample removed, still with both sided protected by the cardboard paper. After said procedure, the sample (now in the form of a pellet) is ready for analysis.

Spectrometric Analysis

The sample is placed onto the excitation stand under an argon atmosphere of the spectrometer. Subsequently the fully automated analysis (software of the spectrometer manufacturer) is initiated. The analysis is repeated (the sample pellet is rotated each time) until a reproducible analytic result is obtained. The instrument is calibrated with an internal standard that has been analyzed by external accredited laboratories.

Reference

K. Slickers, Automatic Emission Spectroscopy, Bruhl, Druck and Presshaus Giessen (D), (1992)

Spring-Back

The spring-back is a source of information regarding the resilience of compacted graphite powders. A defined amount of powder is poured into a die of 20 mm diameter. After inserting the punch and sealing the die, air is evacuated from the die. Compression force of 1.5 metric tons is applied resulting in a pressure of 0.477 $t/cm^2$ and the powder height is recorded. This height is recorded again after pressure has been released. Spring-back is the height difference in percent relative to the height under pressure.

PAH Concentration

The concentration of polycyclic aromatic hydrocarbons PAH was determined by the Grimmer method and the analyses were performed externally by BIU-Grimmer (Germany). The Grimmer method generally used for PAH analysis is based on a stable isotope dilution methodology using GC-MS(SIM) for quantification in the sub ppb range.

SEM/EDX (Scanning Electron Microscopy/Energy-Dispersive X-Ray Spectroscopy)

SEM/EDX measurements were carried out with a Jeol JSM-5600LV SEM instrument equipped with an Oxford Instruments X-Max EDX probe.

Contact Angle/Wettability

At 20° C., with a spatula 1 $cm^3$ of graphite powder are spread on a microscope slide and pressed with a pressure of 1 bar in order to prepare a surface as flat as possible. Afterwards, a drop of demineralized water with a volume of 10 μL is dropped on the powder surface using Easy Drop (Kruss GmbH, Hamburg, Germany). Using Drop Shape Analyses DSA1 software (Kruss GmbH, Hamburg, Germany) employing Tangent Method 1 with system water (Strom et al., *J. Colloid Interface Sci.*, 1987, 119, 352), the contact angle between the water droplet and the powder is determined. In general, a material is considered to be hydrophilic when the contact angle in this test is below 90°. If the contact angle is above 90°, the material is considered to be hydrophobic. The contact angle values are determined 1 second, 3 seconds and 5 seconds after the water droplet lands on the graphite surface. In case that the water droplet is absorbed immediately by the powder, the contact angle value cannot be calculated. In these cases, the value 0° is assigned, indicating a very hydrophilic material.

Wettability/Surface Energy Measurement

At 20° C., with a spatula 1 $cm^3$ of graphite powder are spread on a microscope slide and pressed with a pressure of 1 bar in order to prepare a surface as flat as possible. Aqueous solutions with 2.7% weight % of 2-propanol were prepared with distilled, deionized water. The surface tension of such a solution is 59 mN $m^{-1}$ or 59 $mJ/m^2$ (extrapolated from Vazquez et al., *J. Chem. Eng. Data*, 1995, 40, 611-614). Afterwards, a drop of this solution with total volume of 10 μL is dropped on the powder surface using Easy Drop (Kruss GmbH, Hamburg, Germany).

Using Drop Shape Analyses DSA1 software (Kruss GmbH, Hamburg, Germany) employing Tangent Method 1 with system water (Strom et al., *J. Colloid Interface Sci.*, 1987, 119, 352), the contact angle between the solution droplet and the powder is determined. A material is considered to be hydrophilic when the contact angle in this test is below 90°. If the contact angle is above 90°, the material is considered to be hydrophobic.

Viscosity

Water-based electrode slurries based on graphite (97% of solid content), SBR latex binder (2% of solid content), CMC binder (1% of solid content, viscosity of 1% CMC solution in water: 2,000 mPa·s) are prepared using a mechanical stirrer. The solid content of the slurries are given in Tables 2 & 3. The rheology of the dispersion is measured using a Molecular Compact Rheometer MCR300 (Physica, Germany) equipped with a cone/plate-measuring system. The measuring temperature is 20° C. Viscosity values are determined in [mPa·s] at a shear rate of 10 $s^{-1}$.

Reference

DIN 3219

Lithium-Ion Negative Electrode Half Cell Tests

General Half-Cell Parameters:

2 Electrode coin cell design with lithium metal foil as counter/reference electrode, cell assembly in an argon filled glove box (oxygen and water content <1 ppm).

Diameter of electrodes: 13 mm.

A calibrated spring (100 kN) is used in order to have a defined force on the electrode. Tests are carried out at 25° C.

Coating on Cu foil: 100-200 μm (Doctor Blade).

Drying procedure: coated Cu foils are dried for 15 min at ambient pressure, followed by drying under vacuum (<50 mbar, at 120° C. if the carbonaceous particulate material contains no Si, at 150° C. if the carbonaceous particulate material contains Si). After cutting, the electrodes are dried for 10 h at 120° C. if the carbonaceous particulate material contains no Si, at 150° C. if the carbonaceous particulate material contains Si under vacuum (<50 mbar), before insertion into the glove box.

Pressing: Electrode foils are pressed at 10-40 kN/cm$^2$ for 1 second using a hydraulic press, leading to electrode densities of 1.4-1.8 g/cm$^3$.

Electrolyte: Ethylenecarbonate (EC): Ethylmethylcarbonate (EMC) 1:3 (v/v), 1 M LiPF$_6$ Separator: glass fiber sheet, ca. 1 mm thickness.

Cycling program using a potentiostat: 1$^{st}$ charge: constant current step 20 mA/g to a potential of 5 mV vs. Li/Li$^+$, followed by a constant voltage step at 5 mV vs. Li/Li$^+$ until a cutoff current of 5 mA/g is reached. 1$^{st}$ discharge: constant current step 20 mA/g to a potential of 1.5 V vs. Li/Li$^+$, followed by a constant voltage step at 1.5 V vs. Li/Li$^+$ until a cutoff current of 5 mA/g is reached. Further charge cycles: constant current step at 0.13 C to a potential of 5 mV vs. Li/Li$^+$, followed by a constant voltage step at 5 mV vs. Li/Li$^+$ until a cutoff current of 5 mA/g is reached. Further discharge cycles: constant current step at 1 C (if the carbonaceous particulate material contains Si), or 3 C (if the carbonaceous particulate material contains no Si) to a potential of 1.5 V vs. Li/Li$^+$, followed by constant voltage step at 1.5 V vs. Li/Li$^+$ until a cutoff current of 5 mA/g is reached.

Procedure with CMC (carboxymethyl cellulose)/SBR (styrene butadiene rubber) binders, dispersion formulation: if the carbonaceous particulate material contains no Si: 97% graphite (active material, 48.5 g), 2% SBR (styrene butadiene rubber) binder (48 weight % in water, 2.08 g), 1% CMC (sodium carboxymethyl cellulose) binder (1.0 weight % in water, 50.0 g). If the carbonaceous particulate material contains Si: 95% active material (47.5 g), 1% of a conductive carbon black additive (0.5 g), 2.5% SBR (styrene butadiene rubber) binder (48 weight % in water, 2.6 g), 1.5% CMC (sodium carboxymethyl cellulose) binder (1.5 weight % in water, 50.0 g).

Dispersion preparation: if the carbonaceous particulate material contains no Si: A dispersion of the CMC binder solution and the carbonaceous particulate material is prepared in a flask that can be put under vacuum, followed by mixing with a glass rod until the graphite is fully wetted. The slurry is stirred with a mechanical mixer (600 rpm) for 30 minutes under vacuum (<50 mbar). The vacuum is temporarily removed and the SBR binder solution is added. The slurry is stirred with a mechanical mixer (600 rpm) for another 30 min under vacuum (<50 mbar). If the carbonaceous particulate material contains Si: A dispersion of the CMC binder solution, a conductive carbon black additive and 20 mL deionized water is prepared in a flask that can be put under vacuum, followed by mixing with a rotor-stator mixer (11,000 rpm), followed by the addition of the carbonaceous particulate material material. The slurry is stirred with a mechanical mixer (1,000 rpm) for 20 min under vacuum (<50 mbar). The vacuum is temporarily removed and the SBR binder solution is added. The slurry is stirred with a mechanical mixer (1,000 rpm) for another 20 min under vacuum (<50 mbar).

Calculation of 'Retention of galvanostatic charge capacity 0.13 C, cycle 15/5': the charge capacity at constant current (0.13 C) at cycle 15 is divided through the corresponding value at cycle 5 [%].

Calculation of 'Retention of galvanostatic discharge capacity 3 C, cycle 15/5': the charge capacity at constant current (3 C) at cycle 15 is divided through the corresponding value at cycle 5 [%].

Having described the various aspects of the present invention in general terms, it will be apparent to those of skill in the art that many modifications and slight variations are possible without departing from the spirit and scope of the present invention.

EXAMPLES

Example 1

The material to be treated, ground synthetic graphite GRAPHITE A, with a particle size distribution of 7 µm and 33 µm for $D_{10}$ and $D_{90}$ respectively, was continuously fed into a rotary furnace reactor heated to 1050° C. The mixture of propane ($C_3H_8$) gas (1 L/min) as a carbon coating precursor and nitrogen ($N_2$) (2 L/min) as carrier gas was fed into the reactor to maintain the pressure in the reactor at 0-40 mbar above atmospheric pressure. The residence time of around 40 minutes was triggered by inclination of the rotary furnace, set to 4° and a rotation speed of 6 RPM.

Subsequently, an oxidation treatment was carried out as follows. CVD-coated GRAPHITE A was fed into the reactor heated to 600° C. with flow of synthetic air (2 L/min) with inclination set to 7.5° and rotational speed of 7.5 RPM resulting in a residence time of about 15 minutes. Burning off the PAH and the creation of functional groups, e.g., carbonyl, carboxyl, hydroxyl, ketone, ketene, aldehyde, alcohol, quinones and alkoxyalkyl groups, resulted in an improved surface reactivity of CVD coated & oxidized GRAPHITE A. The oxidized CVD-coated GRAPHITE A was characterized by contact angle/wettability analyses, oxygen content, and xylene density, and compared to the starting material, the CVD-coated graphite before the oxidation treatment, and to low surface area (pitch coated) graphite as shown in Table 1. Electrochemical results that demonstrate the benefit of the surface treatment process for lithium-ion battery applications are also shown in Table 1.

TABLE 1

Properties of starting material, CVD-coated material, CVD-coated + oxidized material in comparison with low surface area graphite (pitch-coated graphite)

| | GRAPHITE A | CVD-coated GRAPHITE A | CVD-coated & oxidized GRAPHITE A | Pitch-coated natural graphite |
|---|---|---|---|---|
| BET SSA [m$^2$/g] | 6 | 3.5 | 3.6 | 2 |
| D$_{90}$ [µm] | 33 | 34 | 34 | 30 |
| Oxygen Content [ppm] | 660 | | 520 | 100 |
| Mesopore Area [m$^2$/g] | 4.4 | 2.4 | 3.3 | 1.75 |
| Xylene Density [g/cm$^3$] | 2.258 | 2.245 | 2.255 | 2.24 |
| Electrode density after pressing at 40 kN/cm$^2$ [g/cm$^3$], CMC/SBR binder | 2.00 | n.d. | 1.68 | 1.75 |
| 1$^{st}$ cycle discharge capacity [Ah/kg], CMC/SBR binder | 366 | 365 | 368 | n.d. |

TABLE 1-continued

Properties of starting material, CVD-coated material, CVD-coated + oxidized material in comparison with low surface area graphite (pitch-coated graphite)

|  | GRAPHITE A | CVD-coated GRAPHITE A | CVD-coated & oxidized GRAPHITE A | Pitch-coated natural graphite |
|---|---|---|---|---|
| Retention of galvanostatic charge capacity 0.13 C, cycle 15/5 [%], CMC/SBR binder | 70 | 83 | 96 | n.d. |
| Retention of galvanostatic discharge capacity 3 C, cycle 15/5 [%], CMC/SBR binder | 35 | 44 | 88 | n.d. |

Example 2

Synthetic ground GRAPHITE B with a particle size distribution of 9 μm and 34 μm for D10 and D90, respectively, was continuously fed into the rotary furnace reactor heated to 1050° C. The mixture of the propane ($C_3H_8$) gas (2 L/min) as a carbon coating precursor and nitrogen ($N_2$) gas (2 L/min) as a carrier gas was fed into the reactor. The pressure in the reactor was maintained at 0-40 mbar at above atmospheric pressure. The residence time of around 30 minutes was triggered by inclination of the rotary furnace, set to 3° and a rotation speed of 7.5 RPM.

The CVD coated GRAPHITE B material exhibited a decreased BET specific surface area due to the deposition of non-graphitic carbon on the surface of graphite particles, which resulted in the closure of micropores and mesopores on the surface of the graphite particles. The presence of non-graphitic carbon on the surface was determined by Raman spectroscopy as an increase in disorder (increase of band D as well as change in ratio of $I_D/I_G$). The real density of non-graphitic carbon is lower compared to graphitic carbon, resulting in a slight decrease of the xylene density of CVD modified graphite.

Subsequently, CVD-coated GRAPHITE B was subjected to an oxidation treatment. CVD-coated GRAPHITE B was fed into the reactor heated to 600° C. with flow of synthetic air (2 L/min) with inclination set to 5° and a rotational speed of 5 RPM resulting in a residence time of about 15 minutes. The oxidized CVD-coated GRAPHITE B was characterized by contact angle/wettability analyses (shown in FIG. 3), surface energy (shown in Table 7), oxygen content, PAH content, mesopore area, viscosity measurements and xylene density as shown in Table 2 and compared to the starting material, the CVD-coated graphite before the oxidation treatment, and to low surface area (pitch coated) graphite. Transmission Electron Microscopy (TEM) image of CVD-coated and oxidized GRAPHITE B is shown in FIG. 1 and FIG. 2.

TABLE 2

Properties of starting material, oxidized starting material, CVD-coated material, CVD-coated + oxidized material in comparison with low surface area graphite (pitch-coated graphite)

|  | GRAPHITE B | Oxidized GRAPHITE B | CVD-coated GRAPHITE B | CVD-coated & oxidized GRAPHITE B | Pitch-coated natural graphite |
|---|---|---|---|---|---|
| BET SSA [m²/g] | 7.2 | 8.8 | 3.6 | 4.1 | 2 |
| $D_{90}$ [μm] | 34 | 32 | 35 | 35 | 30 |
| PAH [mg/kg] | <3.2 | <3.2 | 1203 | 149 | n.d. |
| Oxygen Content [ppm] | 1550 | n.d. | 1100 | 1700 | 100 |
| Contact Angle after 1 s [°] | 0 | 0 | 130 | 63 | 141.8 |
| Contact Angle after 3 s [°] | 0 | 0 | 130 | 0 | 142 |
| Contact Angle after 5 s [°] | 0 | 0 | 130 | 0 | 141.8 |
| Raman R ($I_D/I_G$) | 0.23 | 0.23 | 0.58 | 0.57 | 0.12 |
| Mesopore Area [m²/g] | 6.7 | 8.4 | 3.4 | 3.8 | 1.75 |
| Viscosity at 10 s⁻¹ [mPa · s], solid content: [39.8%] | 4750 | n.d. | 4720 | 2430 | n.d. |
| Xylene Density [g/cm³] | 2.25 | 2.25 | 2.233 | 2.237 | 2.24 |

Example 3

Natural spherical graphite ("NSG") with a particle size distribution of 11 μm and 28 μm for $D_{10}$ and $D_{90}$ respectively, was continuously fed into the rotary furnace reactor heated to 1050° C. The mixture of propane gas ($C_3H_8$, 2 L/min) as a carbon coating precursor and nitrogen gas ($N_2$, 2 L/min) as carrier gas was fed into the reactor to maintain the pressure in the reactor at 0-40 mbar above atmospheric pressure. The residence time of around 30 minutes was triggered by inclination of the rotary furnace, set to 3° and a rotation speed of 7.5 RPM.

CVD-coated NSG was subsequently fed into the reactor heated to 550° C. with a flow of synthetic air (2 L/min) with inclination set to 5° and a rotational speed of 5 RPM with a residence time of about 20 minutes. The oxidized CVD coated NSG was characterized by contact angle/wettability analyses, surface energy (shown in Table 7), oxygen content, PAH concentration, mesopore area, viscosity measurements, and xylene density and compared to the starting material, the CVD-coated graphite before the oxidation treatment, and to low surface area (pitch-coated) graphite. The results are shown in Table 3.

TABLE 3

Properties of starting material, CVD-coated material, CVD-coated + oxidized material in comparison with low surface area pitch-coated graphite

|  | NSG | CVD-coated NSG | CVD-coated & oxidized NSG | Pitch-coated natural graphite |
|---|---|---|---|---|
| BET SSA [m$^2$/g] | 5.4 | 3.4 | 4 | 2 |
| D$_{90}$ [μm] | 28 | 29 | 29 | 30 |
| PAH [mg/kg] | 0.3 | 489 | 9 | n.d. |
| Oxygen Content [ppm] | 1450 | 460 | 870 | 100 |
| Contact Angle after 1 s [°] | 0 | 144.9 | 97.3 | 141.8 |
| Contact Angle after 3 s [°] | 0 | 143.2 | 63.5 | 142 |
| Contact Angle after 5 s [°] | 0 | 144.7 | 20.5 | 141.8 |
| Mesopore Area [m$^2$/g] | 5.26 | 3.1 | 3.57 | 1.75 |
| Viscosity at 10 s$^{-1}$ [mPa · s], solid content: [39.8%] | n.d. | 1080 | 1050 | n.d. |
| Xylene Density [g/cm$^3$] | 2.26 | 2.241 | 2.249 | 2.24 |

Example 4

Non-ground synthetic graphite (GRAPHITE C) with a particle size distribution of 6 μm and 29 μm for D10 and D90 respectively, was continuously fed into the rotary furnace reactor heated to 700° C. The mixture of the acetylene gas ($C_2H_2$, 1 L/min) as a carbon coating precursor and nitrogen gas ($N_2$, 9 L/min) as carrier gas was fed into the reactor to maintain the pressure in the reactor at 0-40 mbar above atmospheric pressure. The residence time of around 20 minutes was triggered by inclination of the rotary furnace, set to 4° and a rotation speed of 6 RPM.

The oxidation step of CVD coated GRAPHITE C was performed in order to eliminate PAH and to improve wettability as well as to decrease the viscosity of CVD modified GRAPHITE C. CVD-coated GRAPHITE C was fed into the reactor, heated to 600° C. with a flow of synthetic air (2 L/min) with inclination set to 5° and a rotational speed of 5 RPM with a residence time of about 15 minutes. The oxidized CVD-coated GRAPHITE C was characterized by BET SSA, PSD, and xylene density and compared to the starting material, the CVD-coated graphite before the oxidation treatment, and to low surface area (pitch-coated) graphite. The results are shown in Table 4.

TABLE 4

Properties of starting material, CVD-coated material, CVD-coated + oxidized material in comparison with low surface area pitch-coated graphite

|  | GRAPHITE C | CVD coated GRAPHITE C | CVD coated & Oxidized GRAPHITE C | Pitch-coated natural graphite |
|---|---|---|---|---|
| BET SSA [m$^2$/g] | 1.7 | 1.3 | 1.7 | 2.0 |
| D$_{90}$ [μm] | 29 | 29 | 29 | 30 |
| Xylene Density [g/cm$^3$] | 2.252 | 2.246 | 2.252 | 2.24 |

Example 5

Non-ground synthetic graphite (GRAPHITE D), with a particle size distribution of 6 μm and 29 μm for D$_{10}$ and D$_{90}$ respectively, was continuously fed into the rotary furnace reactor heated to 1050° C. The mixture of the propane gas ($C_3H_8$, 2 L/min) as a carbon coating precursor and nitrogen gas ($N_2$, 2 L/min) as carrier gas was fed into the reactor to maintain the pressure in the reactor at 0-40 mbar above atmospheric pressure. The residence time of around 30 minutes was triggered by inclination of the rotary furnace, set to 3° and a rotation speed of 7.5 RPM.

For the oxidation treatment, CVD-coated GRAPHITE D was subsequently fed into the reactor heated to 550° C. with a flow of synthetic air (2 L/min) with inclination set to 5° and a rotational speed of 5 RPM resulting in a residence time of about 20 minutes. The oxidized CVD-coated GRAPHITE D was characterized by BET SSA, PSD, pore size distribution, contact angle/wettability (shown in FIG. 4), oxygen content and xylene density, and compared to the starting material, the CVD-coated graphite before the oxidation treatment, and to low surface area (pitch-coated) graphite. The results are shown in Table 5.

TABLE 5

Properties of starting material, oxidized starting material, CVD-coated material, CVD-coated + oxidized material in comparison with low surface area pitch-coated graphite

|  | GRAPHITE D | Oxidized GRAPHITE D | CVD Coated GRAPHITE D | CVD Coated & Oxidized GRAPHITE D | Pitch Coated Natural Graphite |
|---|---|---|---|---|---|
| BET SSA [m$^2$/g] | 1.7 | 2.3 | 1 | 1.35 | 2 |
| D$_{90}$ [μm] | 29 | 29 | 30 | 30 | 30 |
| Oxygen Content [ppm] | 50-100 | 130 | 620 | 1650 | 100 |
| Contact Angle after 1 s [°] | 141 | 18 | 146 | 21.4 | 141.8 |
| Contact Angle after 3 s [°] | 140.6 | 0 | 145.7 | 0 | 142 |
| Contact Angle after 5 s [°] | 140 | 0 | 145.8 | 0 | 141.8 |
| Raman ratio R($I_D/I_G$) | 0.13 | 0.2 | 0.56 | 0.57 | 0.12 |
| Mesopore Area [m$^2$/g] | 1.43 | 2.28 | 0.87 | 1.26 | 1.75 |
| Xylene Density [g/cm$^3$] | 2.252 | 2.25 | 2.237 | 2.244 | 2.24 |

Example 6

A mechanical blend of 5 wt % nanosilicon powder (Si>99%, 100 nm, polycrystalline, US Research Nanomaterials Inc.) with 95 wt % of synthetic graphite GRAPHITE B was prepared (Si-A). This blend was coated by means of chemical vapor deposition (CVD) with propane ($C_3H_8$) as a carbon source in a tubular furnace. The material was continuously fed into the rotary furnace reactor heated to 1050° C. The mixture of the propane gas (3 L/min) as a carbon coating precursor and nitrogen ($N_2$) gas (1 L/min) as a carrier gas was fed into the reactor. The pressure in the reactor was maintained at 0-40 mbar above atmospheric pressure. The residence time of around 30 minutes was triggered by inclination of the rotary furnace, set to 4° and a rotation speed of 7.5 RPM. This step creates a carbon coating layer on graphite and silicon, resulting in material Si-B. Subsequently, material Si-B (i.e. the CVD-coated blend of GRAPHITE B with 5% nanosilicon) was subjected to an oxidation treatment. Si-B was fed into the reactor heated to 600° C. with flow of synthetic air (2 L/min), with the inclination of the furnace set to 6° and a rotational speed of 6 RPM resulting in a residence time of about 15 minutes, resulting in material Si-C. The results are shown in Table 6.

FIG. 5 demonstrates the favorable electrochemical effects resulting from the hydrophilic non-graphitic carbon coating on silicon-containing carbonaceous particulate material ("Si-C", Si content about 3%). The hydrophilic functional groups on the surface of the Si-C particles allow for the formation of a well-anchored SEI layer with increased robustness as well as stronger interactions with the CMC/SBR binders as compared to comparative particles "Si-B" (with carbon coating, but with a hydrophobic surface due to the lack of the oxidation treatment). This leads in turn to a reduction of parasitic electrochemical processes and reduced capacity fading. Consequently, the irreversible charge losses in the $1^{st}$ and $2^{nd}$ cycles were found to be lower for the Si-C material (17.4%, 4.6%), as compared to the Si-B material (20.7%, 7.0%). Given the similar BET surface area of materials Si-B & Si-C, the reduced irreversible losses in cycles 1 & 2 exhibited by Si-C may be attributed to a reduced specific surface reactivity of said material. Furthermore, capacity fading is reduced in Si-C compared to Si-B, as indicated by a reversible capacity after 5 cycles of 412 Ah/kg for Si-C, whereas the reversible capacity of Si-B was merely 392 Ah/kg. Due to un-optimized electrode and electrolyte parameters, significant cycling losses were observed in both materials over the course of several cycles. However, a reversible capacity difference of 20 Ah/kg between compound Si-B (370 Ah/kg) and compound Si-C (390 Ah/kg) was retained even after 10 cycles, which is attributed to the presence of the hydrophilic surface groups on the carbon coating.

An SEM image of CVD-coated & oxidized silicon/graphite composite material Si-C is shown in FIG. 6 (left panel). The EDX analysis of the material confirms the presence of Si and C (see again FIG. 6, right panel).

TABLE 6

Properties of silicon-containing carbonaceous precursor material Si-A, CVD-coated material Si-B, and CVD-coated + oxidized material Si-C

|  | nanoSi + Graphite B: Si-A | CVD-coated Si-A: Si-B | CVD-coated & oxidized Si-A: Si-C |
|---|---|---|---|
| BET SSA [m²/g] | 7 | 3.5 | 4.2 |
| Xylene Density [g/cm³] | 2.256 | 2.232 | 2.241 |
| wettability | — | hydrophobic | hydrophilic |
| Si [%] | 5 | — | 3.2 |

Example 7

Various carbonaceous particulate materials as described herein were subjected to a surface energy measurement (see Materials and Methods section above for details of the method). Results of the analysis are summarized in the table below.

TABLE 7

Surface Energy of various treated and untreated carbonaceous particulate materials

|  | 2.7% 2-propanol aqueous solution | Surface Energy [mJ/m²] = Surface Tension [mN/m] |
|---|---|---|
| CVD Coated Graphite B (Example 2) | Hydrophobic | <59 |
| CVD Coated & Oxidized Graphite B (Example 2) | Hydrophilic | >59 |
| CVD Coated & Oxidized NSG (Example 3) | Hydrophilic | >59 |
| CVD Coated & Oxidized Si-A (Si-C) (Example 6) | Hydrophilic | >59 |
| Pitch-Coated Natural Graphite | Hydrophobic | <59 |

The invention claimed is:

1. A surface-modified carbonaceous particulate material comprising carbonaceous core particles with a hydrophilic non-graphitic carbon coating, wherein the hydrophilic surface-modified carbonaceous particulate material has a BET specific surface area (BET SSA) of below 49 m²/g; and having an oxygen content of greater than about 200 ppm and up to 1700 ppm.

2. The hydrophilic surface-modified carbonaceous particulate material of claim 1, having a wettability characterized by
   (i) a contact angle after 3 seconds that is less than 90° and
   (ii) a surface energy of said carbonaceous particulate material of at least 59 mJ/m².

3. The surface-modified carbonaceous particulate material of claim 1, having a spring-back ratio of about 15% to about 75%.

4. The hydrophilic surface-modified carbonaceous particulate material of claim 1, having a polycyclic aromatic hydrocarbon (PAH) concentration of less than 200 mg/kg.

5. The hydrophilic surface-modified carbonaceous particulate material of claim 1, wherein the carbonaceous core particles are selected from natural graphite, synthetic graphite, coke, hard carbon, graphitized fine coke, mixtures thereof, or compositions of such carbon particles that further contain silicon, tin, bismuth, antimony, aluminum, silver, SiOx (X=0.2-1.8), or SnO2 particles.

6. The hydrophilic surface-modified carbonaceous particulate material of claim 1, wherein the carbonaceous core particles comprise synthetic graphite particles or a mixture of synthetic graphite particles and silicon particles.

7. The hydrophilic surface-modified carbonaceous particulate material of claim 1, wherein the carbon coating comprises an oxidized amorphous carbon that is obtained by a chemical vapor (CVD) deposition process followed by an oxidation treatment.

8. A surface-modified carbonaceous particulate material comprising carbonaceous core particles with a hydrophilic non-graphitic carbon coating, wherein a ratio between a BET SSA and a specific surface energy of the hydrophilic surface-modified carbonaceous particulate material is less than 0.8; and having an oxygen content of greater than about 200 ppm and up to 1700 ppm.

9. The hydrophilic surface-modified carbonaceous particulate material of claim 1, wherein a low viscosity in aqueous dispersion containing 40 weight % of said carbonaceous material is between about 2,000 mPa·s and about 4,000 mPa·s.

10. A composition comprising the surface-modified carbonaceous particulate material of claim 1.

11. The composition of claim 10, wherein the surface-modified carbonaceous particulate material is a first surface-modified carbonaceous particulate material, and the composition further comprises a second surface-modified carbonaceous particulate material different from the first surface-modified carbonaceous particulate material.

12. The composition of claim 10, further comprising additional carbonaceous particulate material selected from the group consisting of natural or synthetic graphite, exfoliated graphite, carbon black, coke, graphene, graphene fibers, nanotubes, including carbon nanotubes, where the nanotubes are single-walled nanotubes (SWNT), multi-walled nanotubes (IVIWNT), or combinations of these; fuilerene nanographite, graphitized fine coke, and combinations thereof.

13. A polymer composite material comprising the hydrophilic surface-modified carbonaceous particulate material of claim 1 in a weight ratio of 5-95% by weight.

14. A dispersion comprising a liquid and a surface-modified carbonaceous particulate material comprising carbonaceous core particles with a hydrophilic non-graphitic carbon coating, wherein the dispersion comprises 40 weight % of said carbonaceous material and has a viscosity of 2,000 to 4,000 mPa·s; and wherein the surface-modified carbonaceous particulate material has an oxygen content of greater than about 200 ppm and up to 1700 ppm.

15. The dispersion according to claim 14, wherein said surface-modified carbonaceous particulate material has
   (i) a BET SSA of less than 49 $m^2/g$.

16. The dispersion of claim 14, further comprising unmodified carbonaceous particles, wherein the surface-modified carbonaceous particles are present in an amount ranging from 10 to 99 wt. % of a total amount of carbonaceous particles of the dispersion.

17. The surface-modified carbonaceous particulate material of claim 1, wherein the surface-modified carbonaceous particles have an average particle size (D50) ranging from 0.5 to 100 μm.

* * * * *